United States Patent
Oshima et al.

(10) Patent No.: US 10,780,530 B2
(45) Date of Patent: Sep. 22, 2020

(54) SOLDER BALL, SOLDER JOINT, AND JOINING METHOD

(71) Applicant: Senju Metal Industry Co., Ltd., Tokyo (JP)

(72) Inventors: Hiroki Oshima, Tokyo (JP); Takeo Saitoh, Tochigi (JP); Takahiro Nishizaki, Campbell, CA (US); Tomohisa Kawanago, Tochigi (JP); Masato Shiratori, Tochigi (JP); Kaichi Tsuruta, Tochigi (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 16/419,294

(22) Filed: May 22, 2019

(65) Prior Publication Data

US 2019/0358752 A1    Nov. 28, 2019

(30) Foreign Application Priority Data

May 25, 2018   (JP) ................. 2018-100617

(51) Int. Cl.
  *B23K 35/00*     (2006.01)
  *B23K 35/26*     (2006.01)
  *B23K 35/30*     (2006.01)
  *H05K 3/34*      (2006.01)
  *B23K 101/42*    (2006.01)

(52) U.S. Cl.
  CPC ........ *B23K 35/262* (2013.01); *B23K 35/3093* (2013.01); *H05K 3/3457* (2013.01); *B23K 2101/42* (2018.08); *H05K 2203/041* (2013.01)

(58) Field of Classification Search
  CPC .............. B23K 35/262; B23K 35/3093; B23K 2101/42; B23K 35/00; B23K 35/0244; B23K 35/30; B23K 35/26; B23K 35/302; B23K 35/3006; B23K 3/0623; B23K 35/025; B23K 1/00–206; H05K 3/3457; H05K 2203/041; H05K 3/3463
  USPC ................ 228/179.1–180.22, 245–255, 56.3
  See application file for complete search history.

(56) References Cited

U.S. PATENT DOCUMENTS

| | | | |
|---|---|---|---|
| 10,119,177 B2 | 11/2018 | Schenzel et al. | |
| 10,137,535 B2 | 11/2018 | Kawasaki et al. | |
| 2003/0121564 A1 | 7/2003 | Taguchi et al. | |
| 2007/0181218 A1 | 8/2007 | Sakamoto et al. | |
| 2008/0182124 A1* | 7/2008 | Gruber ................. | B23K 35/262 428/646 |
| 2009/0008432 A1 | 1/2009 | Onozaki et al. | |

(Continued)

FOREIGN PATENT DOCUMENTS

| | | |
|---|---|---|
| CN | 1422723 A | 6/2003 |
| CN | 1934690 A | 3/2007 |

(Continued)

*Primary Examiner* — Kiley S Stoner
(74) *Attorney, Agent, or Firm* — The Webb Law Firm (57) ABSTRACT

A solder ball according to the present invention contains 0.2 to 2.2% by mass of Zn, and a balance of Sn, and has a spherical diameter of 0.1 to 120 μm and a yellowness (b*) in an L*a*b* color system of 2.70 or more and 9.52 or less. An oxide film is formed by performing aging treatment. By producing a solder ball having a yellowness of 2.70 or more and 9.52 or less, it is possible to suppress the growth of a $Cu_3Sn$ layer and/or a Cu—Zn(—Sn) layer during joining.

8 Claims, 1 Drawing Sheet

(56) References Cited

U.S. PATENT DOCUMENTS

| | | | |
|---|---|---|---|
| 2013/0333929 A1 | 12/2013 | Ogawa et al. | |
| 2014/0054766 A1* | 2/2014 | Hashino | B23K 35/025 257/737 |
| 2014/0061287 A1* | 3/2014 | Ohnishi | H05K 3/3463 228/246 |
| 2015/0209912 A1* | 7/2015 | Kawasaki | B23K 35/26 174/126.2 |
| 2015/0217408 A1* | 8/2015 | Kawasaki | B23K 35/262 174/126.2 |
| 2015/0221606 A1* | 8/2015 | Yamanaka | H05K 3/3457 228/256 |
| 2015/0316688 A1 | 11/2015 | Cefalo et al. | |
| 2015/0336216 A1 | 11/2015 | Hattori et al. | |
| 2017/0216975 A1* | 8/2017 | Tachibana | C22C 13/02 |
| 2017/0246711 A1* | 8/2017 | Kawasaki | B22F 1/02 |
| 2017/0252871 A1 | 9/2017 | Kawasaki et al. | |
| 2017/0312860 A1* | 11/2017 | Hattori | C25D 5/12 |
| 2018/0001426 A1* | 1/2018 | Suzuki | B23K 35/36 |
| 2018/0047689 A1* | 2/2018 | Hua | H01L 24/03 |
| 2018/0281118 A1* | 10/2018 | Kawasaki | H01L 24/13 |
| 2018/0326545 A1 | 11/2018 | Hayashi et al. | |

FOREIGN PATENT DOCUMENTS

| | | | | |
|---|---|---|---|---|
| CN | 106536124 A | | 3/2017 | |
| GB | 0426383 | * | 1/2005 | ........... B23K 35/262 |
| JP | 1262092 A | | 10/1989 | |
| JP | 2104493 A | | 4/1990 | |
| JP | 10193170 A | | 7/1998 | |
| JP | 2002248596 A | | 9/2002 | |
| JP | 2006289493 A | | 10/2006 | |
| JP | 2009248156 A | | 10/2009 | |
| JP | 2011235294 A | | 11/2011 | |
| JP | 5585751 B1 | | 9/2014 | |
| JP | 5590259 B1 | | 9/2014 | |
| JP | 2017508071 A | | 3/2017 | |
| JP | 2017113756 A | | 6/2017 | |
| JP | 2017515822 A | | 6/2017 | |
| JP | 2017120839 A | | 7/2017 | |
| JP | 6439893 B1 | * | 12/2018 | ............. B23K 35/30 |
| WO | 2007023288 A2 | | 3/2007 | |
| WO | WO-2007023288 A2 | * | 3/2007 | ........... B23K 35/262 |
| WO | 2009090776 A1 | | 7/2009 | |
| WO | 2012118202 A1 | | 9/2012 | |
| WO | 2014109052 A1 | | 7/2014 | |
| WO | 2017057649 A1 | | 4/2017 | |

* cited by examiner

SOLDER BALL, SOLDER JOINT, AND JOINING METHOD

CROSS REFERENCE TO RELATED APPLICATION

This application claims priority to Japanese Patent Application No. 2018-100617 filed May 25, 2018, the disclosure of which is hereby incorporated by reference in its entirety.

BACKGROUND OF THE INVENTION

(1) Field of the Invention

The present invention relates to a solder ball, a solder joint, and a joining method.

(2) Description of Related Art

With recent miniaturization and high-density mounting of electronic components, when mounting electronic components on a printed circuit board or the like, BGA (ball grid array) and CSP (chip size package) techniques have been used. When joining electronic components to a printed circuit board or the like, solder bumps have been first formed on a large number of electrodes arranged on a semiconductor substrate, an electronic member, a printed circuit board, or the like. When forming the solder bumps on the electrodes of the electronic member, it is common to use solder balls obtained by processing a solder alloy into a spherical shape.

Further, as a solder alloy used for soldering electronic components, an Sn—Zn-based lead-free solder alloy has been known. Specifically, JP H1-262092 A discloses a solder in which 0.3 to 3% by weight of Zn is added to an Sn-based solder. JP H2-104493 A discloses a solder for connection wherein an Sn solder contains any one or more of Zn, Mg and Mn in a total amount of 0.1 to 2% by weight. JP H10-193170 A discloses a soldered article containing 0.01 to 5.0% by weight of Zn and the balance of Sn. JP 2006-289493 A discloses an Sn—Zn-based solder containing 0.003 to 5% by weight of zinc or a zinc compound and the balance basically including tin or a tin compound, the zinc or zinc compound being a pseudo-anticorrosive part in the solder or on the surface thereof.

The reason why such an Sn—Zn-based lead-free solder alloy is used in soldering the electronic components is as follows, as described in JP H1-262092 A. When soldering the electronic components, Cu or a Cu alloy is mainly used as a member to be joined (for example, an electrode) from the viewpoint of conductivity and solderability. In this case, Cu in the member to be joined and Sn in the solder react to form intermetallic compounds of $Cu_6Sn_5$ and further $Cu_3Sn$ at an interface between the member to be joined and the solder. The layers of these intermetallic compounds are further thickened when the solder bumps are subjected to current application or exposed to a high temperature atmosphere after soldering, thereby causing deterioration in mechanical strength of the soldered part. Therefore, by using an Sn—Zn-based solder obtained by adding, to a solder alloy, Zn which is more reactive with Cu than Sn and hard to grow intermetallic compounds such as $Cu_3Sn$, the growth of the intermetallic compounds is suppressed.

SUMMARY OF THE INVENTION

In recent years, it is desirable that the solder alloy material has a highly reliability such that it can withstand even various severe environments such as in-vehicle use. However, the Sn—Zn-based lead-free solder alloy described, for example, in JP H1-262092 A has such a problem that it cannot sufficiently satisfy the mechanical strength required in the various environments described above.

Accordingly, the present invention has been made in view of the above issue, and has an object to provide a minute solder ball, a solder joint using the same and a joining method of the same, which can improve the mechanical strength of a soldered part as compared with past one.

The present inventors have paid attention to the above-described effects of Sn—Zn-based lead-free solder alloys, and they have improved the existing Sn—Zn-based lead-free solder alloys to further develop an Sn—Zn-based lead-free solder ball that can suppress the growth of intermetallic compounds (IMCs) in the $Cu_3Sn$ layer and/or the Cu—Zn (—Sn) layer. Specifically, concerning the solder ball obtained by processing an Sn—Zn-based lead-free solder alloy into a ball shape, the present inventors have found that the growth of intermetallic compounds to be formed between a solder and a member to be joined after soldering can be suppressed by subjecting the solder ball itself to aging treatment such as heating, at a stage before joining the solder ball, to thereby form an oxide film enriched with Zn on the surface of the solder ball.

To achieve the above-mentioned object, a solder ball contains 0.2 to 2.2% by mass of Zn, and a balance of Sn, wherein the solder ball has a spherical diameter of 0.1 to 120 μm, and wherein the solder ball has a yellowness (b*) in an L*a*b* color system of 2.70 or more and 9.52 or less and/or a thickness of an oxide film on a surface of the solder ball is 1.5 nm or more and 10.7 nm or less.

A solder joint contains any one of the above solder balls.

A joining method contains the steps of arranging a plurality of any of the above solder balls on electrodes, and melting the plurality of solder balls arranged on the electrodes using an organic acid gas.

According to the present invention, the solder ball mainly composed of Sn, containing 0.2 to 2.2% by mass of Zn, and having a spherical diameter of 0.1 to 120 μm has a yellowness in the L*a*b* color system of 2.70 or more and 9.52 or less. Therefore, it is possible to suppress the growth of the $Cu_3Sn$ layer and/or the Cu—Zn(—Sn) layer which are IMCs.

Other objects and attainments of the present invention will become apparent to those skilled in the art upon a reading of the following detailed description when taken in conjunction with the drawings.

DETAILED DESCRIPTION OF PREFERRED EMBODIMENT

The following will describe preferred embodiments of the present invention more in detail with reference to the drawing. The solder ball according to the present invention is mainly composed of Sn, containing 0.2 to 2.2% by mass of Zn, and having a spherical diameter of 0.1 to 120 μm and a yellowness in the L*a*b* color system of 2.70 or more and 9.52 or less. In the present invention, the solder ball has an oxide film having a predetermined thickness on its surface. The oxide film is formed by performing any aging treatment. Examples of the aging treatment include exposure to the atmosphere (standing) and heat treatment. According to the present invention, a solder ball having a yellowness of 2.70 or more and 9.52 or less is produced, thereby making it possible to suppress the growth of the $Cu_3Sn$ layer and/or the Cu—Zn(—Sn) layer during joining. The following will describe each of the components in detail.

(1) Zn: 0.2 to 2.2% by Mass

The content of Zn in the solder ball is 0.2 to 2.2% by mass. By setting the content of Zn to 0.2% by mass or more, a constant amount of Zn can be secured, so that the growth of the $Cu_3Sn$ layer and/or the Cu—Zn(—Sn) layer can be surely suppressed. In addition, by setting the content of Zn to 2.2% by mass or less, the growth of the oxide film can be suppressed within a certain range, so that the growth of the $Cu_3Sn$ layer and/or the Cu—Zn(—Sn) layer can be suppressed without reducing the wettability of the solder. That is, according to the above range of the Zn content, any aging treatment is applied to an Sn—Zn-based lead-free solder ball in the formation of solder bumps, thereby making it possible to enrich Zn preferentially on the surface of the solder ball. As a result, during solder joining, the Cu—Zn—Sn compound is formed preferentially to the CuSn compound by a reaction of Sn in the solder, Zn enriched on the solder surface, and Cu on the electrode side. Since the Cu—Zn—Sn compound is less likely to grow than the CuSn compound, it allows the growth of the $Cu_3Sn$ layer and/or the Cu—Zn(—Sn) layer to be suppressed.

(2) Spherical Diameter of Solder Ball: 0.1 to 120 μm

The spherical diameter of the solder ball is 0.1 to 120 μm. This is because, if the spherical diameter of the solder ball exceeds 120 μm, it is difficult to solder with a fine pitch, so that it is impossible to cope with the demand for the miniaturization of the substrate and the narrowing of the electrodes of the electronic components. The lower limit value is set to 0.1 μm or more, as the limit of the spherical diameter of the solder ball that can be technically used for solder bump formation. As described above, by setting the spherical diameter of the solder ball within the range of 0.1 to 120 μm, it is possible to cope with the miniaturization and high integration of the electronic components. Furthermore, the above-described effect of suppressing the growth of the $Cu_3Sn$ layer and/or the Cu—Zn(—Sn) layer is exhibited as the particle diameter of the solder ball decreases, and the spherical diameter of the solder ball is preferably 120 μm or less, more preferably 80 μm or less, still more preferably 50 μm or less, most preferably 30 μm or less.

(3) Yellowness in L*a*b* Color System: 2.70 or More and 9.52 or Less

The yellowness in the L*a*b* color system of the solder ball is 2.70 or more and 9.52 or less. If the yellowness is 2.70 or more and 9.52 or less, it is possible to suppress the growth of the $Cu_3Sn$ layer and/or the Cu—Zn(—Sn) layer during joining. More preferably, the yellowness is 2.70 or more and 4.00 or less. When the solder ball is subjected to any aging treatment at a predetermined temperature for a predetermined time, an oxide film containing a large amount of zinc oxide (ZnO) is formed on the surface of the solder ball, so that an enrichment phenomenon occurs in which the concentration of Zn on the surface of the solder ball increases. Even when the Zn content is as low as 0.2 to 2.2% by mass as in the present invention, the concentration of Zn on the solder ball surface can be increased by intentionally oxidizing the solder ball surface, whereby the effect of suppressing the growth of the $Cu_3Sn$ layer and/or the Cu—Zn(—Sn) layer can be obtained. Here, it is considered that, if the solder ball is excessively oxidized to increase the concentration of Zn on the surface of the solder ball, the growth of the $Cu_3Sn$ layer and/or the Cu—Zn(—Sn) layer can be suppressed more effectively. However, in a solder ball having a spherical diameter of 120 μm or less, the influences of the oxide film are particularly great, thereby causing a problem of reduction in reliability during solder joining. Therefore, it is necessary to manage the oxide film thickness so as to satisfy both of the conditions for the oxide film thickness in consideration of the solderability and the conditions for the oxide film thickness in consideration of the suppression of the growth of the $Cu_3Sn$ layer and/or the Cu—Zn(—Sn) layer by enrichment of Zn. Therefore, in the present invention, in order to manage the thickness of the oxide film formed on the surface of the solder ball simply and quickly, the yellowness in the L*a*b* color system is adopted, and a solder ball having a yellowness of 2.70 or more and 9.52 or less in the L*a*b* color system is produced, thereby realizing a solder ball having a predetermined oxide film thickness. If the yellowness is less than 2.70, Zn is not enriched, so that the growth of the $Cu_3Sn$ layer and/or the Cu—Zn(—Sn) layer cannot be effectively suppressed during solder bump formation. On the other hand, if the yellowness exceeds 9.52, the wettability of the solder during solder ball joining may be impaired. As a result, it is possible to provide a solder ball capable of effectively suppressing the growth of the $Cu_3Sn$ layer and/or the Cu—Zn(—Sn) layer without reducing the solder wettability.

(4) Addition of at Least One Element Selected from a Group Consisting of: Ag, Cu, Ag, Bi, in, Sb, Ni, Co, Fe, Ge and P and Ag: 0 to 4% by Mass; Cu: 0 to 1.0% by Mass; Bi, in or Sb: 0 to 3% by Mass in Total; and Ni, Co, Fe, Ge or P: 0 to 0.1% by Mass, in Total The solder ball that constitutes the present invention may contain Ag, Cu, Bi, In, Ni, Sb, Co, Fe, Ge, and/or P in the above-described ranges. This enables the joining reliability to be improved. The contents of Ag, Cu, Bi, In, Ni, Sb, Co, Fe, Ge and/or P are preferably set: Ag: 0 to 4% by mass; Cu: 0 to 1.0% by mass; Bi, In or Sb: 0 to 3% by mass in total; and Ni, Co, Fe, Ge or P: 0 to 0.1% by mass in total, since a reaction between Zn and the joining member must not be disturbed.

(5) Sn as Main Component

The main component of the solder ball according to the present invention is Sn, and the content thereof is always highest among the metal elements in the solder ball. In addition, the solder ball according to the present invention may contain inevitable impurities. Even when the solder ball contains inevitable impurities, the above-described effects are not affected.

(6) Alpha (α) Dose: 0.0200 cph/cm² or Less

The α dose of the solder ball according to the present invention is 0.0200 cph/cm² or less from the viewpoint of suppressing soft errors. This is an α dose such that soft errors would not become a problem in high-density mounting of the electronic components. The α dose is more preferably 0.0010 cph/cm² or less from the viewpoint of suppressing soft errors in higher-density mounting.

(7) Method for Manufacturing Solder Ball

First, a solder ball having a spherical diameter of 0.1 to 120 μm and containing 0.2 to 2.2% by mass of Zn is produced. As a method of producing the solder ball, a known method such as a dropping method in which a molten solder is added dropwise and processed into a spherical shape or a gas atomizing method can be adopted. One or more elements selected from a group consisting of Ag, Cu, Bi, In, Ni, Sb, Co, Fe, Ge, and P may be added to the solder ball.

Next, the solder ball thus produced is subjected to any aging treatment to form an oxide film on the surface of the solder ball, thereby controlling the concentration of Zn on the surface of the solder ball to be high. In the aging treatment, the heating temperature and the heating time are set so as to attain an oxide film thickness such that the yellowness of the solder ball is 2.70 or more and 9.52 or less. Also, as other methods for controlling the concentration of Zn to be high, there are indicated: storing the solder ball in a state of being exposed to the atmosphere at room temperature for a long time; aging by increasing the oxygen concentration during ball formation; and oxygen plasma irradiation at least either during ball formation or after ball formation. Thus, it is possible to produce a solder ball in which an oxide film having a certain thickness is formed on its surface.

The solder ball according to the present invention can also be used to form a solder joint for joining electrodes. In the present invention, for example, a structure in which a solder bump is mounted on an electrode of a printed board is referred to as "solder joint". The solder bump means, for example, a structure in which a solder ball is mounted on an electrode of a semiconductor chip.

The solder ball according to the present invention can also be applied to a joining method without using any flux. For example, a plurality of solder balls subjected to any aging treatment are placed on electrodes of a substrate, and then the plurality of solder balls placed thereon are melted using an organic acid gas, thereby forming a solder bump. As the solder balls, used are 50 solder balls, an arithmetic mean of the measured values of diameters of which is 120 μm. Also in this case, the growth of the $Cu_3Sn$ layer and/or the Cu—Zn(—Sn) layer can be effectively suppressed.

EXECUTED EXAMPLES

First, Sn—Zn solder balls each having a spherical diameter of 120 μm and having the alloy composition shown in each of the Executed Examples were prepared. Next, each of the prepared solder balls was subjected to any aging treatments in advance under different conditions, and the surface of each of the solder balls was intentionally oxidized to increase the concentration of Zn on the surface thereof, thereby preparing solder balls having formed thereon an oxide film containing a high concentration of zinc oxide (ZnO). Subsequently, the oxide film thickness and yellowness of each of the solder balls, and the concentration of Zn on the surface of each of the solder balls were measured, and the thicknesses of the $Cu_3Sn$ layer and/or the Cu—Zn(—Sn) layer were evaluated.

(1) Measurement of Thickness of Oxide Film Formed on Each of the Solder Balls

The thickness of the oxide film formed on each of the solder balls was measured using a FE-AES measuring device of ULVAC PHI700. The acceleration voltage of the measuring device was set to 10 kV, and the irradiation current was set to 10 nA. The oxide film thickness (depth) was obtained from the speed (etching rate) at which the surface of a sample was scraped with an ion (Ar), and the etching depth which was a ½ peak value of the intensity derived from oxygen was used as an approximate value of the oxide film thickness. The etching rate is an $SiO_2$-conversion value converted in terms of a speed at which an $SiO_2$ standard sample is scraped.

(2) Measurement of Yellowness of Each of the Solder Balls

The yellowness of each of the solder balls was measured using CM-2600d spectrophotometer manufactured by Konica Minolta, Inc.

(3) Measurement of Concentration on Surface of Each of the Solder Balls

The concentration of Zn on the surface of each of the solder balls was analyzed qualitatively with a field emission electron probe microanalyzer (FE-EPMA), and a semi-quantitative analysis value was quoted. For the concentration of Zn on the surface of each of the solder balls, a semi-quantitative analysis value was calculated in order to make comparison in terms of the concentration change.

(4) Evaluation of Total Thickness of $Cu_3Sn$ Layer and/or Cu—Zn(—Sn) Layer

Flux WF-6317 (manufactured by Senju Metal Industry Co., Ltd.) was printed on an electrode pad of Bare-Cu (bare copper) formed on a substrate, and each of the solder balls was mounted thereon. The temperature of the electrode pad on which the solder ball was mounted was increased from 25° C. to 250° C. in an $N_2$ atmosphere at a temperature increase rate of 5° C./sec, and then reflow soldering was performed for 1 minute. After the reflow soldering, the joined body was cut for each substrate, and the joining interface (cut surface) between the solder ball and the electrode was observed in an SEM image to measure the total thickness of the $Cu_3Sn$ layer and/or the Cu—Zn(—Sn) layer. Then, based on the evaluation of the total thickness of the $Cu_3Sn$ layer and/or the Cu—Zn(—Sn) layer of each of the solder balls of the Comparative Examples shown in the tables, the solder balls having the same alloy composition in each of Tables 1 to 6 were evaluated as follows on the basis of the solder balls not subjected to any aging treatments.

(i) When the total thickness of the $Cu_3Sn$ layer and/or the Cu—Zn(—Sn) layer in the Executed Example (Comparative Example) is less than the total thickness of the $Cu_3Sn$ layer and/or the Cu—Zn(—Sn) layer in the Comparative Example not subjected to any aging treatment, the symbol "o" (good) is shown the tables.

(ii) When the total thickness of the $Cu_3Sn$ layer and/or the Cu—Zn(—Sn) layer in the Example (Comparative Example) is not less than the total thickness of the $Cu_3Sn$ layer and/or the Cu—Zn(—Sn) layer in the Comparative Example not subjected to any aging treatment: the symbol "x" (bad) is shown the tables.

Table 1 indicates the measurement results and evaluation results of the solder balls in each of which the alloy composition is Sn-0.2% by mass Zn.

| No. | Aging condition Temperature/time | Alloy composition | Oxide film thickness (nm) | Yellowness (b*) | Semi-quantitatively analyzed Zn (% by mass) | Whether IMC layers became thinner than those of Comparative Example |
|---|---|---|---|---|---|---|
| EXECUTED EXAMPLE 1 | Normal temperature/3 days | Sn—0.2Zn | 1.5 | 2.77 | 0.463 | ○ |
| EXECUTED EXAMPLE 2 | Normal temperature/7 days | Sn—0.2Zn | 2.0 | 2.81 | 0.471 | ○ |
| EXECUTED EXAMPLE 3 | 200° C./0.5 min | Sn—0.2Zn | 2.1 | 2.97 | 0.492 | ○ |
| EXECUTED EXAMPLE 4 | 200° C./1 min | Sn—0.2Zn | 2.1 | 3.52 | 0.556 | ○ |
| EXECUTED EXAMPLE 5 | 200° C./1.5 min | Sn—0.2Zn | 2.3 | 3.41 | 0.549 | ○ |
| EXECUTED EXAMPLE 6 | 200° C./2 min | Sn—0.2Zn | 2.3 | 3.43 | 0.547 | ○ |
| EXECUTED EXAMPLE 7 | 200° C./5 min | Sn—0.2Zn | 2.7 | 3.48 | 0.531 | ○ |
| EXECUTED EXAMPLE 8 | 200° C./10 min | Sn—0.2Zn | 3.0 | 3.45 | 0.617 | ○ |
| EXECUTED EXAMPLE 9 | 200° C./30 min | Sn—0.2Zn | 3.7 | 3.99 | 0.735 | ○ |
| EXECUTED EXAMPLE 10 | 200° C./60 min | Sn—0.2Zn | 4.1 | 3.99 | 0.902 | ○ |
| EXECUTED EXAMPLE 11 | 200° C./90 min | Sn—0.2Zn | 4.3 | 4.08 | 0.926 | ○ |
| EXECUTED EXAMPLE 12 | 200° C./120 min | Sn—0.2Zn | 4.5 | 4.13 | 0.915 | ○ |
| EXECUTED EXAMPLE 13 | 200° C./300 min | Sn—0.2Zn | 4.7 | 4.48 | 0.938 | ○ |
| EXECUTED EXAMPLE 14 | 200° C./1800 min | Sn—0.2Zn | 9.1 | 5.76 | 0.978 | ○ |
| EXECUTED EXAMPLE 15 | 200° C./2880 min | Sn—0.2Zn | 9.5 | 6.50 | 1.007 | ○ |
| COMPARATIVE EXAMPLE 1 | 0 | Sn—0.2Zn | 0.7 | 2.45 | 0.247 | — |

In Comparative Example 1, solder balls of Sn-0.2% by mass Zn, which were not subjected to any aging treatment, were used. In Comparative Example 1, when the solder ball having a yellowness of 2.45 was selected, the oxide film thickness thereof was 0.7 nm, and the concentration of Zn on the surface of the solder ball was 0.247% by mass. In Table 1, since the total thickness of the Cu$_3$Sn layer and/or the Cu—Zn(—Sn) layer during joining in Comparative Example 1 was a reference for evaluation, it was indicated as "-", not "x".

In Executed Example 1, respective solder balls of Sn-0.2% by mass Zn were subjected to aging treatment involving continuous exposure to the atmosphere at normal temperature of 20° C. to 30° C. for 3 days. According to Executed Example 1, when the solder ball having a yellowness of 2.77 was selected, the oxide film thickness thereof was 1.5 nm, and the concentration of Zn on the surface of the solder ball was 0.463% by mass. In addition, it was confirmed that the Cu$_3$Sn layer and/or the Cu—Zn(—Sn) layer during joining were thinner than those of the solder ball of Comparative Example 1 which was not subjected to any aging treatment, and that the growth of the Cu$_3$Sn layer and/or the Cu—Zn(—Sn) layer was suppressed.

In Executed Example 2, respective solder balls of Sn-0.2% by mass Zn were subjected to aging treatment involving continuous exposure to the atmosphere at normal temperature of 20° C. to 30° C. for 7 days. According to Executed Example 2, when the solder ball having a yellowness of 2.81 was selected, the oxide film thickness thereof was 2.0 nm, and the concentration of Zn on the surface of the solder ball was 0.471% by mass. In addition, it was confirmed that the Cu$_3$Sn layer and/or the Cu—Zn(—Sn) layer during joining were thinner than those of the solder ball of Comparative Example 1 which was not subjected to any aging treatment, and that the growth of the Cu$_3$Sn layer and/or the Cu—Zn(—Sn) layer was suppressed.

In Executed Example 3, respective solder balls of Sn-0.2% by mass Zn were heat-treated at 200° C. for 0.5 minutes. According to Executed Example 3, when the solder ball having a yellowness of 2.97 was selected, the oxide film thickness thereof was 2.1 nm, and the concentration of Zn on the surface of the solder ball was 0.492% by mass. In addition, it was confirmed that the Cu$_3$Sn layer and/or the Cu—Zn(—Sn) layer during joining were thinner than those of the solder ball of Comparative Example 1 which was not subjected to any aging treatment, and that the growth of the Cu$_3$Sn layer and/or the Cu—Zn(—Sn) layer was suppressed.

In Executed Example 4, respective solder balls of Sn-0.2% by mass Zn were heat-treated at 200° C. for 1 minute. According to Executed Example 4, when the solder ball having a yellowness of 3.52 was selected, the oxide film thickness thereof was 2.1 nm, and the concentration of Zn on the surface of the solder ball was 0.556% by mass. In addition, it was confirmed that the Cu$_3$Sn layer and/or the Cu—Zn(—Sn) layer during joining were thinner than those of the solder ball of Comparative Example 1 which was not subjected to any aging treatment, and that the growth of the Cu$_3$Sn layer and/or the Cu—Zn(—Sn) layer was suppressed.

In Executed Example 5, respective solder balls of Sn-0.2% by mass Zn were heat-treated at 200° C. for 1.5 minutes. According to Executed Example 5, when the solder ball having a yellowness of 3.41 was selected, the oxide film thickness thereof was 2.3 nm, and the concentration of Zn on the surface of the solder ball was 0.549% by mass. In addition, it was confirmed that the Cu$_3$Sn layer and/or the Cu—Zn(—Sn) layer during joining were thinner than those of the solder ball of Comparative Example 1 which was not subjected to any aging treatment, and that the growth of the Cu$_3$Sn layer and/or the Cu—Zn(—Sn) layer was suppressed.

In Executed Example 6, respective solder balls of Sn-0.2% by mass Zn were heat-treated at 200° C. for 2 minutes. According to Executed Example 6, when the solder ball having a yellowness of 3.43 was selected, the oxide film thickness thereof was 2.3 nm, and the concentration of Zn on the surface of the solder ball was 0.547% by mass. In addition, it was confirmed that the $Cu_3Sn$ layer and/or the Cu—Zn(—Sn) layer during joining were thinner than those of the solder ball of Comparative Example 1 which was not subjected to any aging treatment, and that the growth of the $Cu_3Sn$ layer and/or the Cu—Zn(—Sn) layer was suppressed.

In Executed Example 7, respective solder balls of Sn-0.2% by mass Zn were heat-treated at 200° C. for 5 minutes. According to Executed Example 7, when the solder balls having a yellowness of 3.48 was selected, the oxide film thickness thereof was 2.7 nm, and the concentration of Zn on the surface of the solder ball was 0.531% by mass. In addition, it was confirmed that the $Cu_3Sn$ layer and/or the Cu—Zn(—Sn) layer during joining were thinner than those of the solder ball of Comparative Example 1 which was not subjected to any aging treatment, and that the growth of the $Cu_3Sn$ layer and/or the Cu—Zn(—Sn) layer was suppressed.

In Executed Example 8, respective solder balls of Sn-0.2% by mass Zn were heat-treated at 200° C. for 10 minutes. According to Executed Example 8, when the solder ball having a yellowness of 3.45 was selected, the oxide film thickness thereof was 3.0 nm, and the concentration of Zn on the surface of the solder ball was 0.617% by mass. In addition, it was confirmed that the $Cu_3Sn$ layer and/or the Cu—Zn(—Sn) layer during joining were thinner than those of the solder ball of Comparative Example 1 which was not subjected to any aging treatment, and that the growth of the $Cu_3Sn$ layer and/or the Cu—Zn(—Sn) layer was suppressed.

In Executed Example 9, respective solder balls of Sn-0.2% by mass Zn were heat-treated at 200° C. for 30 minutes. According to Executed Example 9, when the solder ball having a yellowness of 3.99 was selected, the oxide film thickness thereof was 3.7 nm, and the concentration of Zn on the surface of the solder ball was 0.735% by mass. In addition, it was confirmed that the $Cu_3Sn$ layer and/or the Cu—Zn(—Sn) layer during joining were thinner than those of the solder ball of Comparative Example 1 which was not subjected to any aging treatment, and that the growth of the $Cu_3Sn$ layer and/or the Cu—Zn(—Sn) layer was suppressed.

In Executed Example 10, respective solder balls of Sn-0.2% by mass Zn were heat-treated at 200° C. for 60 minutes. According to Executed Example 10, when the solder ball having a yellowness of 3.99 was selected, the oxide film thickness thereof was 4.1 nm, and the concentration of Zn on the surface of the solder ball was 0.902% by mass. In addition, it was confirmed that the $Cu_3Sn$ layer and/or the Cu—Zn(—Sn) layer during joining were thinner than those of the solder ball of Comparative Example 1 which was not subjected to any aging treatment, and that the growth of the $Cu_3Sn$ layer and/or the Cu—Zn(—Sn) layer was suppressed.

In Executed Example 11, respective solder balls of Sn-0.2% by mass Zn were heat-treated at 200° C. for 90 minutes. According to Executed Example 11, when the solder ball having a yellowness of 4.08 was selected, the oxide film thickness thereof was 4.3 nm, and the concentration of Zn on the surface of the solder ball was 0.926% by mass. In addition, it was confirmed that the $Cu_3Sn$ layer and/or the Cu—Zn(—Sn) layer during joining were thinner than those of the solder ball of Comparative Example 1 which was not subjected to any aging treatment, and that the growth of the $Cu_3Sn$ layer and/or the Cu—Zn(—Sn) layer was suppressed.

In Executed Example 12, respective solder balls of Sn-0.2% by mass Zn were heat-treated at 200° C. for 120 minutes. According to Executed Example 12, when the solder ball having a yellowness of 4.13 was selected, the oxide film thickness thereof was 4.5 nm, and the concentration of Zn on the surface of the solder ball was 0.915% by mass. In addition, it was confirmed that the $Cu_3Sn$ layer and/or the Cu—Zn(—Sn) layer during joining were thinner than those of the solder ball of Comparative Example 1 which was not subjected to any aging treatment, and that the growth of the $Cu_3Sn$ layer and/or the Cu—Zn(—Sn) layer was suppressed.

In Executed Example 13, respective solder balls of Sn-0.2% by mass Zn were heat-treated at 200° C. for 300 minutes. According to Executed Example 13, when the solder ball having a yellowness of 4.48 was selected, the oxide film thickness thereof was 4.7 nm, and the concentration of Zn on the surface of the solder ball was 0.938% by mass. In addition, it was confirmed that the $Cu_3Sn$ layer and/or the Cu—Zn(—Sn) layer during joining were thinner than those of the solder ball of Comparative Example 1 which was not subjected to any aging treatment, and that the growth of the $Cu_3Sn$ layer and/or the Cu—Zn(—Sn) layer was suppressed.

In Executed Example 14, respective solder balls of Sn-0.2% by mass Zn were heat-treated at 200° C. for 1800 minutes. According to Executed Example 14, when the solder ball having a yellowness of 5.76 was selected, the oxide film thickness thereof was 9.1 nm, and the concentration of Zn on the surface of the solder ball was 0.978% by mass. In addition, it was confirmed that the $Cu_3Sn$ layer and/or the Cu—Zn(—Sn) layer during joining were thinner than those of the solder ball of Comparative Example 1 which was not subjected to any aging treatment, and that the growth of the $Cu_3Sn$ layer and/or the Cu—Zn(—Sn) layer was suppressed.

In Executed Example 15, respective solder balls of Sn-0.2% by mass Zn were heat-treated at 200° C. for 2880 minutes. According to Executed Example 15, when the solder ball having a yellowness of 6.50 was selected, the oxide film thickness thereof was 9.5 nm, and the concentration of Zn on the surface of the solder ball was 1.007% by mass. In addition, it was confirmed that the $Cu_3Sn$ layer and/or the Cu—Zn(—Sn) layer during joining were thinner than those of the solder ball of Comparative Example 1 which was not subjected to any aging treatment, and that the growth of the $Cu_3Sn$ layer and/or the Cu—Zn(—Sn) layer was suppressed.

Table 2 indicates the measurement results and evaluation results of the solder balls each of which the alloy composition is Sn-0.6% by mass Zn.

| No. | Aging condition Temperature/time | Alloy composition | Oxide film thickness (nm) | Yellowness (b*) | Semi-quantitatively analyzed Zn (% by mass) | Whether IMC layers became thinner than those of Comparative Example |
|---|---|---|---|---|---|---|
| EXECUTED EXAMPLE 16 | Normal temperature/3 days | Sn—0.6Zn | 1.6 | 2.71 | 0.627 | ○ |
| EXECUTED EXAMPLE 17 | Normal temperature/7 days | Sn—0.6Zn | 2.3 | 2.85 | 0.639 | ○ |
| EXECUTED EXAMPLE 18 | 200° C./0.5 min | Sn—0.6Zn | 2.3 | 3.15 | 0.677 | ○ |
| EXECUTED EXAMPLE 19 | 200° C./1 min | Sn—0.6Zn | 2.3 | 3.68 | 0.552 | ○ |
| EXECUTED EXAMPLE 20 | 200° C./1.5 min | Sn—0.6Zn | 2.3 | 3.70 | 0.531 | ○ |
| EXECUTED EXAMPLE 21 | 200° C./2 min | Sn—0.6Zn | 2.3 | 3.50 | 0.507 | ○ |
| EXECUTED EXAMPLE 22 | 200° C./5 min | Sn—0.6Zn | 2.6 | 3.64 | 0.623 | ○ |
| EXECUTED EXAMPLE 23 | 200° C./10 min | Sn—0.6Zn | 2.9 | 3.68 | 0.773 | ○ |
| EXECUTED EXAMPLE 24 | 200° C./30 min | Sn—0.6Zn | 4.0 | 4.14 | 0.757 | ○ |
| EXECUTED EXAMPLE 25 | 200° C./60 min | Sn—0.6Zn | 4.9 | 4.36 | 1.171 | ○ |
| EXECUTED EXAMPLE 26 | 200° C./90 min | Sn—0.6Zn | 5.2 | 4.55 | 1.249 | ○ |
| EXECUTED EXAMPLE 27 | 200° C./120 min | Sn—0.6Zn | 5.4 | 4.78 | 1.261 | ○ |
| EXECUTED EXAMPLE 28 | 200° C./300 min | Sn—0.6Zn | 5.5 | 4.96 | 1.456 | ○ |
| EXECUTED EXAMPLE 29 | 200° C./1800 min | Sn—0.6Zn | 9.7 | 8.09 | 2.078 | ○ |
| EXECUTED EXAMPLE 30 | 200° C./2880 min | Sn—0.6Zn | 10.6 | 9.52 | 2.116 | ○ |
| COMPARATIVE EXAMPLE 2 | 0 | Sn—0.6Zn | 0.7 | 2.51 | 0.443 | — |

In Comparative Example 2, solder balls of Sn-0.6% by mass Zn, which were not subjected to any aging treatment, were used. In Comparative Example 2, when the solder ball having a yellowness of 2.51 was selected, the oxide film thickness thereof was 0.7 nm, and the concentration of Zn on the surface of the solder ball was 0.443% by mass. In Table 2, since the total thickness of the $Cu_3Sn$ layer and/or the Cu—Zn(—Sn) layer during joining in Comparative Example 2 was a reference for evaluation, it was indicated as "-", not "x".

In Executed Example 16, respective solder balls of Sn-0.6% by mass Zn were subjected to aging treatment involving continuous exposure to the atmosphere at normal temperature of 20° C. to 30° C. for 3 days. According to Executed Example 16, when the solder ball having a yellowness of 2.71 was selected, the oxide film thickness thereof was 1.6 nm, and the concentration of Zn on the surface of the solder ball was 0.627% by mass. In addition, it was confirmed that the $Cu_3Sn$ layer and/or the Cu—Zn(—Sn) layer during joining were thinner than those of the solder ball of Comparative Example 2 which was not subjected to any aging treatment, and that the growth of the $Cu_3Sn$ layer and/or the Cu—Zn(—Sn) layer was suppressed.

In Executed Example 17, respective solder balls of Sn-0.6% by mass Zn were continued to be exposed to the atmosphere at normal temperature of 20° C. to 30° C. for 7 days. According to Executed Example 17, when the solder ball having a yellowness of 2.85 was selected, the oxide film thickness thereof was 2.3 nm, and the concentration of Zn on the surface of the solder ball was 0.639% by mass. In addition, it was confirmed that the $Cu_3Sn$ layer and/or the Cu—Zn(—Sn) layer during joining were thinner than those of the solder ball of Comparative Example 2 which was not subjected to any aging treatment, and that the growth of the $Cu_3Sn$ layer and/or the Cu—Zn(—Sn) layer was suppressed.

In Executed Example 18, respective solder balls of Sn-0.6% by mass Zn were heat-treated at 200° C. for 0.5 minutes. According to Executed Example 18, when the solder ball having a yellowness of 3.15 was selected, the oxide film thickness thereof was 2.3 nm, and the concentration of Zn on the surface of the solder ball was 0.677% by mass. In addition, it was confirmed that the $Cu_3Sn$ layer and/or the Cu—Zn(—Sn) layer during joining were thinner than those of the solder ball of Comparative Example 2 which was not subjected to any aging treatment, and that the growth of the $Cu_3Sn$ layer and/or the Cu—Zn(—Sn) layer was suppressed.

In Executed Example 19, respective solder balls of Sn-0.6% by mass Zn were heat-treated at 200° C. for 1 minute. According to Executed Example 19, when the solder ball having a yellowness of 3.68 was selected, the oxide film thickness thereof was 2.3 nm, and the concentration of Zn on the surface of the solder ball was 0.552% by mass. In addition, it was confirmed that the $Cu_3Sn$ layer and/or the Cu—Zn(—Sn) layer during joining were thinner than those of the solder ball of Comparative Example 2 which was not subjected to any aging treatment, and that the growth of the $Cu_3Sn$ layer and/or the Cu—Zn(—Sn) layer was suppressed.

In Executed Example 20, respective solder balls of Sn-0.6% by mass Zn were heat-treated at 200° C. for 1.5 minutes. According to Executed Example 20, when the solder ball having a yellowness of 3.70 was selected, the oxide film thickness thereof was 2.3 nm, and the concentration of Zn on the surface of the solder ball was 0.531% by mass. In addition, it was confirmed that the $Cu_3Sn$ layer and/or the Cu—Zn(—Sn) layer during joining were thinner than those of the solder ball of Comparative Example 2 which was not subjected to any aging treatment, and that the growth of the $Cu_3Sn$ layer and/or the Cu—Zn(—Sn) layer was suppressed.

In Executed Example 21, respective solder balls of Sn-0.6% by mass Zn were heat-treated at 200° C. for 2 minutes. According to Executed Example 21, when the solder ball having a yellowness of 3.50 was selected, the oxide film thickness thereof was 2.3 nm, and the concentration of Zn on the surface of the solder ball was 0.507% by mass. In addition, it was confirmed that the $Cu_3Sn$ layer and/or the Cu—Zn(—Sn) layer during joining were thinner than those of the solder ball of Comparative Example 2 which was not subjected to any aging treatment, and that the growth of the $Cu_3Sn$ layer and/or the Cu—Zn(—Sn) layer was suppressed.

In Executed Example 22, respective solder balls of Sn-0.6% by mass Zn were heat-treated at 200° C. for 5 minutes. According to Executed Example 22, when the solder ball having a yellowness of 3.64 was selected, the oxide film thickness thereof was 2.6 nm, and the concentration of Zn on the surface of the solder ball was 0.623% by mass. In addition, it was confirmed that the $Cu_3Sn$ layer and/or the Cu—Zn(—Sn) layer during joining were thinner than those of the solder ball of Comparative Example 2 which was not subjected to any aging treatment, and that the growth of the $Cu_3Sn$ layer and/or the Cu—Zn(—Sn) layer was suppressed.

In Executed Example 23, respective solder balls of Sn-0.6% by mass Zn were heat-treated at 200° C. for 10 minutes. According to Executed Example 23, when the solder ball having a yellowness of 3.68 was selected, the oxide film thickness thereof was 2.9 nm, and the concentration of Zn on the surface of the solder ball was 0.773% by mass. In addition, it was confirmed that the $Cu_3Sn$ layer and/or the Cu—Zn(—Sn) layer during joining were thinner than those of the solder ball of Comparative Example 2 which was not subjected to any aging treatment, and that the growth of the $Cu_3Sn$ layer and/or the Cu—Zn(—Sn) layer was suppressed.

In Executed Example 24, respective solder balls of Sn-0.6% by mass Zn were heat-treated at 200° C. for 30 minutes. According to Executed Example 24, when the solder ball having a yellowness of 4.14 was selected, the oxide film thickness thereof was 4.0 nm, and the concentration of Zn on the surface of the solder ball was 0.757% by mass. In addition, it was confirmed that the $Cu_3Sn$ layer and/or the Cu—Zn(—Sn) layer during joining were thinner than those of the solder ball of Comparative Example 2 which was not subjected to any aging treatment, and that the growth of the $Cu_3Sn$ layer and/or the Cu—Zn(—Sn) layer was suppressed.

In Executed Example 25, respective solder balls of Sn-0.6% by mass Zn were heat-treated at 200° C. for 60 minutes. According to Executed Example 25, when the solder ball having a yellowness of 4.36 was selected, the oxide film thickness thereof was 4.9 nm, and the concentration of Zn on the surface of the solder ball was 1.171% by mass. In addition, it was confirmed that the $Cu_3Sn$ layer and/or the Cu—Zn(—Sn) layer during joining were thinner than those of the solder ball of Comparative Example 2 which was not subjected to any aging treatment, and that the growth of the $Cu_3Sn$ layer and/or the Cu—Zn(—Sn) layer was suppressed.

In Executed Example 26, respective solder balls of Sn-0.6% by mass Zn were heat-treated at 200° C. for 90 minutes. According to Executed Example 26, when the solder ball having a yellowness of 4.55 was selected, the oxide film thickness thereof was 5.2 nm, and the concentration of Zn on the surface of the solder ball was 1.249% by mass. In addition, it was confirmed that the $Cu_3Sn$ layer and/or the Cu—Zn(—Sn) layer during joining were thinner than those of the solder ball of Comparative Example 2 which was not subjected to any aging treatment, and that the growth of the $Cu_3Sn$ layer and/or the Cu—Zn(—Sn) layer was suppressed.

In Executed Example 27, respective solder balls of Sn-0.6% by mass Zn were heat-treated at 200° C. for 120 minutes. According to Executed Example 27, when the solder ball having a yellowness of 4.78 was selected, the oxide film thickness thereof was 5.4 nm, and the concentration of Zn on the surface of the solder ball was 1.261% by mass. In addition, it was confirmed that the $Cu_3Sn$ layer and/or the Cu—Zn(—Sn) layer during joining were thinner than those of the solder ball of Comparative Example 2 which was not subjected to any aging treatment, and that the growth of the $Cu_3Sn$ layer and/or the Cu—Zn(—Sn) layer was suppressed.

In Executed Example 28, respective solder balls of Sn-0.6% by mass Zn were heat-treated at 200° C. for 300 minutes. According to Executed Example 28, when the solder ball having a yellowness of 4.96 was selected, the oxide film thickness thereof was 5.5 nm, and the concentration of Zn on the surface of the solder ball was 1.456% by mass. In addition, it was confirmed that the $Cu_3Sn$ layer and/or the Cu—Zn(—Sn) layer during joining were thinner than those of the solder ball of Comparative Example 2 which was not subjected to any aging treatment, and that the growth of the $Cu_3Sn$ layer and/or the Cu—Zn(—Sn) layer was suppressed.

In Executed Example 29, respective solder balls of Sn-0.6% by mass Zn were heat-treated at 200° C. for 1800 minutes. According to Executed Example 29, when the solder ball having a yellowness of 8.09 was selected, the oxide film thickness thereof was 9.7 nm, and the concentration of Zn on the surface of the solder ball was 2.078% by mass. In addition, it was confirmed that the $Cu_3Sn$ layer and/or the Cu—Zn(—Sn) layer during joining were thinner than those of the solder ball of Comparative Example 2 which was not subjected to any aging treatment, and that the growth of the $Cu_3Sn$ layer and/or the Cu—Zn(—Sn) layer was suppressed.

In Executed Example 30, respective solder balls of Sn-0.6% by mass Zn were heat-treated at 200° C. for 2880 minutes. According to Executed Example 30, when the solder ball having a yellowness of 9.52 was selected, the oxide film thickness thereof was 10.6 nm, and the concentration of Zn on the surface of the solder ball was 2.116% by mass. In addition, it was confirmed that the $Cu_3Sn$ layer and/or the Cu—Zn(—Sn) layer during joining were thinner than those of the solder ball of Comparative Example 2 which was not subjected to any aging treatment, and that the growth of the $Cu_3Sn$ layer and/or the Cu—Zn(—Sn) layer was suppressed.

Table 3 indicates the measurement results and evaluation results of the solder balls each of which the alloy composition is Sn-2% by mass Zn.

| No. | Aging condition Temperature/time | Alloy composition | Oxide film thickness (nm) | Yellowness (b*) | Semi-quantitatively analyzed Zn (% by mass) | Whether IMC layers became thinner than those of Comparative Example |
|---|---|---|---|---|---|---|
| EXECUTED EXAMPLE 31 | Normal temperature/3 days | Sn—2Zn | 1.6 | 2.70 | 0.635 | ○ |
| EXECUTED EXAMPLE 32 | Normal temperature/7 days | Sn—2Zn | 2.5 | 2.93 | 0.651 | ○ |
| EXECUTED EXAMPLE 33 | 200° C./0.5 min | Sn—2Zn | 2.5 | 3.12 | 0.693 | ○ |
| EXECUTED EXAMPLE 34 | 200° C./1 min | Sn—2Zn | 2.5 | 3.61 | 0.669 | ○ |
| EXECUTED EXAMPLE 35 | 200° C./1.5 min | Sn—2Zn | 2.5 | 3.48 | 0.701 | ○ |
| EXECUTED EXAMPLE 36 | 200° C./2 min | Sn—2Zn | 2.5 | 3.57 | 0.743 | ○ |
| EXECUTED EXAMPLE 37 | 200° C./5 min | Sn—2Zn | 2.8 | 3.72 | 0.981 | ○ |
| EXECUTED EXAMPLE 38 | 200° C./10 min | Sn—2Zn | 3.2 | 3.81 | 1.034 | ○ |
| EXECUTED EXAMPLE 39 | 200° C./30 min | Sn—2Zn | 4.2 | 4.05 | 1.165 | ○ |
| EXECUTED EXAMPLE 40 | 200° C./60 min | Sn—2Zn | 5.0 | 4.28 | 1.200 | ○ |
| EXECUTED EXAMPLE 41 | 200° C./90 min | Sn—2Zn | 5.5 | 4.48 | 1.286 | ○ |
| EXECUTED EXAMPLE 42 | 200° C./120 min | Sn—2Zn | 5.7 | 4.42 | 1.523 | ○ |
| EXECUTED EXAMPLE 43 | 200° C./300 min | Sn—2Zn | 5.9 | 4.79 | 1.855 | ○ |
| EXECUTED EXAMPLE 44 | 200° C./1800 min | Sn—2Zn | 9.9 | 6.33 | 2.199 | ○ |
| EXECUTED EXAMPLE 45 | 200° C./2880 min | Sn—2Zn | 10.7 | 7.33 | 2.217 | ○ |
| COMPARATIVE EXAMPLE 3 | 0 | Sn—2Zn | 0.9 | 2.55 | 0.492 | — |

In Comparative Example 3, solder balls of Sn-2% by mass Zn, which were not subjected to any aging treatment, were used. In Comparative Example 3, when the solder ball having a yellowness of 2.55 were selected, the oxide film thickness thereof was 0.9 nm, and the concentration of Zn on the surface of the solder ball was 0.492% by mass. In Table 3, since the total thickness of the $Cu_3Sn$ layer and/or the Cu—Zn(—Sn) layer during joining in Comparative Example 3 was a reference for evaluation, it was indicated as "-", not "x".

In Executed Example 31, respective solder balls of Sn-2% by mass Zn were subjected to aging treatment involving continuous exposure to the atmosphere at normal temperature of 20° C. to 30° C. for 3 days. According to Executed Example 31, when the solder ball having a yellowness of 2.70 was selected, the oxide film thickness thereof was 1.6 nm, and the concentration of Zn on the surface of the solder ball was 0.635% by mass. In addition, it was confirmed that the $Cu_3Sn$ layer and/or the Cu—Zn(—Sn) layer during joining were thinner than those of the solder ball of Comparative Example 3 which was not subjected to any aging treatment, and that the growth of the $Cu_3Sn$ layer and/or the Cu—Zn(—Sn) layer was suppressed.

In Executed Example 32, respective solder balls of Sn-2% by mass Zn were subjected to aging treatment involving continuous exposure to the atmosphere at normal temperature of 20° C. to 30° C. for 7 days. According to Executed Example 32, when the solder ball having a yellowness of 2.93 was selected, the oxide film thickness thereof was 2.5 nm, and the concentration of Zn on the surface of the solder ball was 0.651% by mass. In addition, it was confirmed that the $Cu_3Sn$ layer and/or the Cu—Zn(—Sn) layer during joining were thinner than those of the solder ball of Comparative Example 3 which was not subjected to any aging treatment, and that the growth of the $Cu_3Sn$ layer and/or the Cu—Zn(—Sn) layer was suppressed.

In Executed Example 33, respective solder balls of Sn-2% by mass Zn were heat-treated at 200° C. for 0.5 minutes. According to Executed Example 33, when the solder ball having a yellowness of 3.12 was selected, the oxide film thickness thereof was 2.5 nm, and the concentration of Zn on the surface of the solder ball was 0.693% by mass. In addition, it was confirmed that the $Cu_3Sn$ layer and/or the Cu—Zn(—Sn) layer during joining were thinner than those of the solder ball of Comparative Example 3 which was not subjected to any aging treatment, and that the growth of the $Cu_3Sn$ layer and/or the Cu—Zn(—Sn) layer was suppressed.

In Executed Example 34, respective solder balls of Sn-2% by mass Zn were heat-treated at 200° C. for 1 minute. According to Executed Example 34, when the solder ball having a yellowness of 3.61 were selected, the oxide film thickness thereof was 2.5 nm, and the concentration of Zn on the surface of the solder ball was 0.669% by mass. In addition, it was confirmed that the $Cu_3Sn$ layer and/or the Cu—Zn(—Sn) layer during joining were thinner than those of the solder ball of Comparative Example 3 which was not subjected to any aging treatment, and that the growth of the $Cu_3Sn$ layer and/or the Cu—Zn(—Sn) layer was suppressed.

In Executed Example 35, respective solder balls of Sn-2% by mass Zn were heat-treated at 200° C. for 1.5 minutes. According to Executed Example 35, when the solder ball having a yellowness of 3.48 was selected, the oxide film thickness thereof was 2.5 nm, and the concentration of Zn on the surface of the solder ball was 0.701% by mass. In addition, it was confirmed that the $Cu_3Sn$ layer and/or the Cu—Zn(—Sn) layer during joining were thinner than those of the solder ball of Comparative Example 3 which was not subjected to any aging treatment, and that the growth of the $Cu_3Sn$ layer and/or the Cu—Zn(—Sn) layer was suppressed.

In Executed Example 36, respective solder balls of Sn-2% by mass Zn were heat-treated at 200° C. for 2 minutes. According to Executed Example 36, when the solder ball having a yellowness of 3.57 was selected, the oxide film thickness thereof was 2.5 nm, and the concentration of Zn on the surface of the solder ball was 0.743% by mass. In addition, it was confirmed that the $Cu_3Sn$ layer and/or the Cu—Zn(—Sn) layer during joining were thinner than those of the solder ball of Comparative Example 3 which was not subjected to any aging treatment, and that the growth of the $Cu_3Sn$ layer and/or the Cu—Zn(—Sn) layer was suppressed.

In Executed Example 37, respective solder balls of Sn-2% by mass Zn were heat-treated at 200° C. for 5 minutes. According to Executed Example 37, when the solder ball having a yellowness of 3.72 was selected, the oxide film thickness thereof was 2.8 nm, and the concentration of Zn on the surface of the solder ball was 0.981% by mass. In addition, it was confirmed that the $Cu_3Sn$ layer and/or the Cu—Zn(—Sn) layer during joining were thinner than those of the solder ball of Comparative Example 3 which was not subjected to any aging treatment, and that the growth of the $Cu_3Sn$ layer and/or the Cu—Zn(—Sn) layer was suppressed.

In Executed Example 38, respective solder balls of Sn-2% by mass Zn were heat-treated at 200° C. for 10 minutes. According to Executed Example 38, when the solder ball having a yellowness of 3.81 was selected, the oxide film thickness thereof was 3.2 nm, and the concentration of Zn on the surface of the solder ball was 1.034% by mass. In addition, it was confirmed that the $Cu_3Sn$ layer and/or the Cu—Zn(—Sn) layer during joining were thinner than those of the solder ball of Comparative Example 3 which was not subjected to any aging treatment, and that the growth of the $Cu_3Sn$ layer and/or the Cu—Zn(—Sn) layer was suppressed.

In Executed Example 39, respective solder balls of Sn-2% by mass Zn were heat-treated at 200° C. for 30 minutes. According to Executed Example 39, when the solder ball having a yellowness of 4.05 was selected, the oxide film thickness thereof was 4.2 nm, and the concentration of Zn on the surface of the solder ball was 1.165% by mass. In addition, it was confirmed that the $Cu_3Sn$ layer and/or the Cu—Zn(—Sn) layer during joining were thinner than those of the solder ball of Comparative Example 3 which was not subjected to any aging treatment, and that the growth of the $Cu_3Sn$ layer and/or the Cu—Zn(—Sn) layer was suppressed.

In Executed Example 40, respective solder balls of Sn-2% by mass Zn were heat-treated at 200° C. for 60 minutes. According to Executed Example 40, when the solder ball having a yellowness of 4.28 was selected, the oxide film thickness thereof was 5.0 nm, and the concentration of Zn on the surface of the solder ball was 1.200% by mass. In addition, it was confirmed that the $Cu_3Sn$ layer and/or the Cu—Zn(—Sn) layer during joining were thinner than those of the solder ball of Comparative Example 3 which was not subjected to any aging treatment, and that the growth of the $Cu_3Sn$ layer and/or the Cu—Zn(—Sn) layer was suppressed.

In Executed Example 41, respective solder balls of Sn-2% by mass Zn were heat-treated at 200° C. for 90 minutes. According to Executed Example 41, when the solder ball having a yellowness of 4.48 was selected, the oxide film thickness thereof was 5.5 nm, and the concentration of Zn on the surface of the solder ball was 1.286% by mass. In addition, it was confirmed that the $Cu_3Sn$ layer and/or the Cu—Zn(—Sn) layer during joining were thinner than those of the solder ball of Comparative Example 3 which was not subjected to any aging treatment, and that the growth of the $Cu_3Sn$ layer and/or the Cu—Zn(—Sn) layer was suppressed.

In Executed Example 42, respective solder balls of Sn-2% by mass Zn were heat-treated at 200° C. for 120 minutes. According to Executed Example 42, when the solder ball having a yellowness of 4.42 was selected, the oxide film thickness thereof was 5.7 nm, and the concentration of Zn on the surface of the solder ball was 1.523% by mass. In addition, it was confirmed that the $Cu_3Sn$ layer and/or the Cu—Zn(—Sn) layer during joining were thinner than those of the solder ball of Comparative Example 3 which was not subjected to any aging treatment, and that the growth of the $Cu_3Sn$ layer and/or the Cu—Zn(—Sn) layer was suppressed.

In Executed Example 43, respective solder balls of Sn-2% by mass Zn were heat-treated at 200° C. for 300 minutes. According to Executed Example 43, when the solder ball having a yellowness of 4.79 was selected, the oxide film thickness thereof was 5.9 nm, and the concentration of Zn on the surface of the solder ball was 1.855% by mass. In addition, it was confirmed that the $Cu_3Sn$ layer and/or the Cu—Zn(—Sn) layer during joining were thinner than those of the solder ball of Comparative Example 3 which was not subjected to any aging treatment, and that the growth of the $Cu_3Sn$ layer and/or the Cu—Zn(—Sn) layer was suppressed.

In Executed Example 44, respective solder balls of Sn-2% by mass Zn were heat-treated at 200° C. for 1800 minutes. According to Executed Example 44, when the solder ball having a yellowness of 6.33 was selected, the oxide film thickness thereof was 9.9 nm, and the concentration of Zn on the surface of the solder ball was 2.199% by mass. In addition, it was confirmed that the $Cu_3Sn$ layer and/or the Cu—Zn(—Sn) layer during joining were thinner than those of the solder ball of Comparative Example 3 which was not subjected to any aging treatment, and that the growth of the $Cu_3Sn$ layer and/or the Cu—Zn(—Sn) layer was suppressed.

In Executed Example 45, respective solder balls of Sn-2% by mass Zn were heat-treated at 200° C. for 2880 minutes. According to Executed Example 45, when the solder ball having a yellowness of 7.33 was selected, the oxide film thickness thereof was 10.7 nm, and the concentration of Zn on the surface of the solder ball was 2.217% by mass. In addition, it was confirmed that the $Cu_3Sn$ layer and/or the Cu—Zn(—Sn) layer during joining were thinner than those of the solder ball of Comparative Example 3 which was not subjected to any aging treatment, and that the growth of the $Cu_3Sn$ layer and/or the Cu—Zn(—Sn) layer was suppressed.

Table 4 indicates the measurement results and evaluation results of the solder balls each of which the alloy composition is Sn-2.2% by mass Zn.

| No. | Aging condition Temperature/time | Alloy composition | Oxide film thickness (nm) | Yellowness (b*) | Semi-quantitatively analyzed Zn (% by mass) | Whether IMC layers became thinner than those of Comparative Example |
|---|---|---|---|---|---|---|
| EXECUTED EXAMPLE 46 | Normal temperature/3 days | Sn—2.2Zn | 1.8 | 2.73 | 0.651 | ○ |
| EXECUTED EXAMPLE 47 | Normal temperature/7 days | Sn—2.2Zn | 2.5 | 3.03 | 0.673 | ○ |

-continued

| No. | Aging condition Temperature/time | Alloy composition | Oxide film thickness (nm) | Yellowness (b*) | Semi-quantitatively analyzed Zn (% by mass) | Whether IMC layers became thinner than those of Comparative Example |
|---|---|---|---|---|---|---|
| EXECUTED EXAMPLE 48 | 200° C./0.5 min | Sn—2.2Zn | 2.5 | 3.21 | 0.705 | ◯ |
| EXECUTED EXAMPLE 49 | 200° C./1 min | Sn—2.2Zn | 2.5 | 3.68 | 0.710 | ◯ |
| EXECUTED EXAMPLE 50 | 200° C./1.5 min | Sn—2.2Zn | 2.5 | 3.42 | 0.733 | ◯ |
| EXECUTED EXAMPLE 51 | 200° C./2 min | Sn—2.2Zn | 2.6 | 3.55 | 0.762 | ◯ |
| EXECUTED EXAMPLE 52 | 200° C./5 min | Sn—2.2Zn | 2.9 | 3.74 | 1.114 | ◯ |
| EXECUTED EXAMPLE 53 | 200° C./10 min | Sn—2.2Zn | 3.2 | 3.77 | 1.132 | ◯ |
| EXECUTED EXAMPLE 54 | 200° C./30 min | Sn—2.2Zn | 4.1 | 4.12 | 1.227 | ◯ |
| EXECUTED EXAMPLE 55 | 200° C./60 min | Sn—2.2Zn | 5.2 | 4.28 | 1.286 | ◯ |
| EXECUTED EXAMPLE 56 | 200° C./90 min | Sn—2.2Zn | 5.5 | 4.30 | 1.358 | ◯ |
| EXECUTED EXAMPLE 57 | 200° C./120 min | Sn—2.2Zn | 5.7 | 4.51 | 1.649 | ◯ |
| EXECUTED EXAMPLE 58 | 200° C./300 min | Sn—2.2Zn | 5.8 | 4.69 | 1.863 | ◯ |
| EXECUTED EXAMPLE 59 | 200° C./1800 min | Sn—2.2Zn | 10.1 | 6.28 | 2.216 | ◯ |
| EXECUTED EXAMPLE 60 | 200° C./2880 min | Sn—2.2Zn | 10.6 | 7.40 | 2.284 | ◯ |
| COMPARATIVE EXAMPLE 4 | 0 | Sn—2.2Zn | 0.9 | 2.53 | 0.509 | — |

In Comparative Example 4, solder balls of Sn-2.2% by mass Zn, which were not subjected to any aging treatment, were used. In Comparative Example 4, when the solder ball having a yellowness of 2.53 was selected, the oxide film thickness thereof was 0.9 nm, and the concentration of Zn on the surface of the solder ball was 0.509% by mass. In Table 4, since the total thickness of the Cu$_3$Sn layer and/or the Cu—Zn(—Sn) layer during joining in Comparative Example 4 was a reference for evaluation, it was indicated as "-", not "x".

In Executed Example 46, respective solder balls of Sn-2.2% by mass Zn were subjected to aging treatment involving continuous exposure to the atmosphere at normal temperature of 20° C. to 30° C. for 3 days. According to Executed Example 46, when the solder ball having a yellowness of 2.73 was selected, the oxide film thickness thereof was 1.8 nm, and the concentration of Zn on the surface of the solder ball was 0.651% by mass. In addition, it was confirmed that the Cu$_3$Sn layer and/or the Cu—Zn(—Sn) layer during joining were thinner than those of the solder ball of Comparative Example 4 which was not subjected to any aging treatment, and that the growth of the Cu$_3$Sn layer and/or the Cu—Zn(—Sn) layer was suppressed.

In Executed Example 47, respective solder balls of Sn-2.2% by mass Zn were subjected to aging treatment involving continuous exposure to the atmosphere at normal temperature of 20° C. to 30° C. for 7 days. According to Executed Example 47, when the solder ball having a yellowness of 3.03 was selected, the oxide film thickness thereof was 2.5 nm, and the concentration of Zn on the surface of the solder ball was 0.673% by mass. In addition, it was confirmed that the Cu$_3$Sn layer and/or the Cu—Zn(—Sn) layer during joining were thinner than those of the solder ball of Comparative Example 4 which was not subjected to any aging treatment, and that the growth of the Cu$_3$Sn layer and/or the Cu—Zn(—Sn) layer was suppressed.

In Executed Example 48, respective solder balls of Sn-2.2% by mass Zn were heat-treated at 200° C. for 0.5 minutes. According to Executed Example 48, when the solder ball having a yellowness of 3.21 was selected, the oxide film thickness thereof was 2.5 nm, and the concentration of Zn on the surface of the solder ball was 0.705% by mass. In addition, it was confirmed that the Cu$_3$Sn layer and/or the Cu—Zn(—Sn) layer during joining were thinner than those of the solder ball of Comparative Example 4 which was not subjected to any aging treatment, and that the growth of the Cu$_3$Sn layer and/or the Cu—Zn(—Sn) layer was suppressed.

In Executed Example 49, respective solder balls of Sn-2.2% by mass Zn were heat-treated at 200° C. for 1 minute. According to Executed Example 49, when the solder ball having a yellowness of 3.68 was selected, the oxide film thickness thereof was 2.5 nm, and the concentration of Zn on the surface of the solder ball was 0.710% by mass. In addition, it was confirmed that the Cu$_3$Sn layer and/or the Cu—Zn(—Sn) layer during joining were thinner than those of the solder ball of Comparative Example 4 which was not subjected to any aging treatment, and that the growth of the Cu$_3$Sn layer and/or the Cu—Zn(—Sn) layer was suppressed.

In Executed Example 50, respective solder balls of Sn-2.2% by mass Zn were heat-treated at 200° C. for 1.5 minutes. According to Executed Example 50, when the solder ball having a yellowness of 3.42 was selected, the oxide film thickness thereof was 2.5 nm, and the concentration of Zn on the surface of the solder ball was 0.733% by mass. In addition, it was confirmed that the Cu$_3$Sn layer and/or the Cu—Zn(—Sn) layer during joining were thinner than those of the solder ball of Comparative Example 4 which was not subjected to any aging treatment, and that the growth of the Cu$_3$Sn layer and/or the Cu—Zn(—Sn) layer was suppressed.

In Executed Example 51, respective solder balls of Sn-2.2% by mass Zn were heat-treated at 200° C. for 2 minutes. According to Executed Example 51, when the solder ball having a yellowness of 3.55 was selected, the oxide film thickness thereof was 2.6 nm, and the concentration of Zn on the surface of the solder ball was 0.762% by mass. In addition, it was confirmed that the $Cu_3Sn$ layer and/or the Cu—Zn(—Sn) layer during joining were thinner than those of the solder ball of Comparative Example 4 which was not subjected to any aging treatment, and that the growth of the $Cu_3Sn$ layer and/or the Cu—Zn(—Sn) layer was suppressed.

In Executed Example 52, respective solder balls of Sn-2.2% by mass Zn were heat-treated at 200° C. for 5 minutes. According to Executed Example 52, when the solder ball having a yellowness of 3.74 was selected, the oxide film thickness thereof was 2.9 nm, and the concentration of Zn on the surface of the solder ball was 1.114% by mass. In addition, it was confirmed that the $Cu_3Sn$ layer and/or the Cu—Zn(—Sn) layer during joining were thinner than those of the solder ball of Comparative Example 4 which was not subjected to any aging treatment, and that the growth of the $Cu_3Sn$ layer and/or the Cu—Zn(—Sn) layer was suppressed.

In Executed Example 53, respective solder balls of Sn-2.2% by mass Zn were heat-treated at 200° C. for 10 minutes. According to Executed Example 53, when the solder ball having a yellowness of 3.77 was selected, the oxide film thickness thereof was 3.2 nm, and the concentration of Zn on the surface of the solder ball was 1.132% by mass. In addition, it was confirmed that the $Cu_3Sn$ layer and/or the Cu—Zn(—Sn) layer during joining were thinner than those of the solder ball of Comparative Example 4 which was not subjected to any aging treatment, and that the growth of the $Cu_3Sn$ layer and/or the Cu—Zn(—Sn) layer was suppressed.

In Executed Example 54, respective solder balls of Sn-2.2% by mass Zn were heat-treated at 200° C. for 30 minutes. According to Executed Example 54, when the solder ball having a yellowness of 4.12 was selected, the oxide film thickness thereof was 4.1 nm, and the concentration of Zn on the surface of the solder ball was 1.227% by mass. In addition, it was confirmed that the $Cu_3Sn$ layer and/or the Cu—Zn(—Sn) layer during joining were thinner than those of the solder ball of Comparative Example 4 which was not subjected to any aging treatment, and that the growth of the $Cu_3Sn$ layer and/or the Cu—Zn(—Sn) layer was suppressed.

In Executed Example 55, respective solder balls of Sn-2.2% by mass Zn were heat-treated at 200° C. for 60 minutes. According to Executed Example 55, when the solder ball having a yellowness of 4.28 was selected, the oxide film thickness thereof was 5.2 nm, and the concentration of Zn on the surface of the solder ball was 1.286% by mass. In addition, it was confirmed that the $Cu_3Sn$ layer and/or the Cu—Zn(—Sn) layer during joining were thinner than those of the solder ball of Comparative Example 4 which was not subjected to any aging treatment, and that the growth of the $Cu_3Sn$ layer and/or the Cu—Zn(—Sn) layer was suppressed.

In Executed Example 56, respective solder balls of Sn-2.2% by mass Zn were heat-treated at 200° C. for 90 minutes. According to Executed Example 56, when the solder ball having a yellowness of 4.30 was selected, the oxide film thickness thereof was 5.5 nm, and the concentration of Zn on the surface of the solder ball was 1.358% by mass. In addition, it was confirmed that the $Cu_3Sn$ layer and/or the Cu—Zn(—Sn) layer during joining were thinner than those of the solder ball of Comparative Example 4 which was not subjected to any aging treatment, and that the growth of the $Cu_3Sn$ layer and/or the Cu—Zn(—Sn) layer was suppressed.

In Executed Example 57, respective solder balls of Sn-2.2% by mass Zn were heat-treated at 200° C. for 120 minutes. According to Executed Example 57, when the solder ball having a yellowness of 4.51 was selected, the oxide film thickness thereof was 5.7 nm, and the concentration of Zn on the surface of the solder ball was 1.649% by mass. In addition, it was confirmed that the $Cu_3Sn$ layer and/or the Cu—Zn(—Sn) layer during joining were thinner than those of the solder ball of Comparative Example 4 which was not subjected to any aging treatment, and that the growth of the $Cu_3Sn$ layer and/or the Cu—Zn(—Sn) layer was suppressed.

In Executed Example 58, respective solder balls of Sn-2.2% by mass Zn were heat-treated at 200° C. for 300 minutes. According to Executed Example 58, when the solder ball having a yellowness of 4.69 was selected, the oxide film thickness thereof was 5.8 nm, and the concentration of Zn on the surface of the solder ball was 1.863% by mass. In addition, it was confirmed that the $Cu_3Sn$ layer and/or the Cu—Zn(—Sn) layer during joining were thinner than those of the solder ball of Comparative Example 4 which was not subjected to any aging treatment, and that the growth of the $Cu_3Sn$ layer and/or the Cu—Zn(—Sn) layer was suppressed.

In Executed Example 59, respective solder balls of Sn-2.2% by mass Zn were heat-treated at 200° C. for 1800 minutes. According to Executed Example 59, when the solder ball having a yellowness of 6.28 was selected, the oxide film thickness thereof was 10.1 nm, and the concentration of Zn on the surface of the solder ball was 2.216% by mass. In addition, it was confirmed that the $Cu_3Sn$ layer and/or the Cu—Zn(—Sn) layer during joining were thinner than those of the solder ball of Comparative Example 4 which was not subjected to any aging treatment, and that the growth of the $Cu_3Sn$ layer and/or the Cu—Zn(—Sn) layer was suppressed.

In Executed Example 60, respective solder balls of Sn-2.2% by mass Zn were heat-treated at 200° C. for 2880 minutes. According to Executed Example 60, when the solder ball having a yellowness of 7.40 was selected, the oxide film thickness thereof was 10.6 nm, and the concentration of Zn on the surface of the solder ball was 2.284% by mass. In addition, it was confirmed that the $Cu_3Sn$ layer and/or the Cu—Zn(—Sn) layer during joining were thinner than those of the solder ball of Comparative Example 4 which was not subjected to any aging treatment, and that the growth of the $Cu_3Sn$ layer and/or the Cu—Zn(—Sn) layer was suppressed.

Table 5 indicates the measurement results and evaluation results of the solder balls in each of which the alloy composition is Sn-0.6% by mass Zn-1.0% by mass Ag-0.5% by mass Cu.

TABLE 5

| No. | Aging condition | | | Oxide film thickness (nm) | Yellowness (b*) | Semi-quantitatively analyzed Zn (% by mass) | Comparison in IMC with Comparative Example |
|---|---|---|---|---|---|---|---|
| EXECUTED EXAMPLE 61 | Normal temperature | | 7 days | 2.3 | 2.76 | 0.652 | ○ |
| EXECUTED EXAMPLE 62 | 200° C. | | 5 min | 2.7 | 3.53 | 0.619 | ○ |
| EXECUTED EXAMPLE 63 | 200° C. | | 10 min | 3.1 | 3.59 | 0.745 | ○ |
| EXECUTED EXAMPLE 64 | 200° C. | | 60 min | 4.8 | 4.20 | 1.211 | ○ |
| COMPARATIVE EXAMPLE 5 | 0 | | | 0 | 0.8 | 2.43 | 0.428 | — |

In Comparative Example 5, solder balls of Sn-0.6% by mass Zn-1.0% by mass Ag-0.5% by mass Cu, which were not subjected to any aging treatment, were used. In Comparative Example 5, when the solder ball having a yellowness of 2.43 was selected, the oxide film thickness thereof was 0.8 nm, and the concentration of Zn on the surface of the solder ball was 0.428% by mass. In Table 5, since the total thickness of the $Cu_3Sn$ layer and/or the Cu—Zn(—Sn) layer during joining in Comparative Example 5 was a reference for evaluation, it was indicated as "-", not "x".

In Executed Example 61, respective solder balls of Sn-0.6% by mass Zn-1.0% by mass Ag-0.5% by mass Cu were subjected to aging treatment involving continuous exposure to the atmosphere at normal temperature of 20° C. to 30° C. for 7 days. According to Executed Example 61, when the solder ball having a yellowness of 2.76 was selected, the oxide film thickness was 2.3 nm, and the concentration of Zn on the surface of the solder ball was 0.652% by mass. In addition, it was confirmed that the $Cu_3Sn$ layer and/or the Cu—Zn(—Sn) layer during joining were thinner than those of the solder ball of Comparative Example 5 which was not subjected to any aging treatment, and that the growth of the $Cu_3Sn$ layer and/or the Cu—Zn (—Sn) layer was suppressed.

In Executed Example 62, respective solder balls of Sn-0.6% by mass Zn-1.0% by mass Ag-0.5% by mass Cu were subjected to aging treatment involving continuous exposure to the atmosphere at 200° C. for 5 minutes. According to Executed Example 62, when the solder ball having a yellowness of 3.53 was selected, the oxide film thickness thereof was 2.7 nm, and the concentration of Zn on the surface of the solder ball was 0.619% by mass. In addition, it was confirmed that the $Cu_3Sn$ layer and/or the Cu—Zn(—Sn) layer during joining were thinner than those of the solder ball of Comparative Example 5 which was not subjected to any aging treatment, and that the growth of the $Cu_3Sn$ layer and/or the Cu—Zn(—Sn) layer was suppressed.

In Executed Example 63, respective solder balls of Sn-0.6% by mass Zn-1.0% by mass Ag-0.5% by mass Cu were subjected to aging treatment involving continuous exposure to the atmosphere at 200° C. for 10 minutes. According to Executed Example 63, when the solder ball having a yellowness of 3.59 was selected, the oxide film thickness thereof was 3.1 nm, and the concentration of Zn on the surface of the solder ball was 0.745% by mass. In addition, it was confirmed that the $Cu_3Sn$ layer and/or the Cu—Zn(—Sn) layer during joining were thinner than those of the solder ball of Comparative Example 5 which was not subjected to any aging treatment, and that the growth of the $Cu_3Sn$ layer and/or the Cu—Zn(—Sn) layer was suppressed.

In Executed Example 64, respective solder balls of Sn-0.6% by mass Zn-1.0% by mass Ag-0.5% by mass Cu were subjected to aging treatment involving continuous exposure to the atmosphere at 200° C. for 60 minutes. According to Executed Example 64, when the solder ball having a yellowness of 4.20 was selected, the oxide film thickness thereof was 4.8 nm, and the concentration of Zn on the surface of the solder ball was 1.211% by mass. In addition, it was confirmed that the $Cu_3Sn$ layer and/or the Cu—Zn(—Sn) layer during joining were thinner than those of the solder ball of Comparative Example 5 which was not subjected to any aging treatment, and that the growth of the $Cu_3Sn$ layer and/or the Cu—Zn(—Sn) layer was suppressed.

Table 6 indicates the measurement results and evaluation results of the solder balls in each of which the alloy composition is Sn-0.6% by mass Zn-0.5% by mass Cu.

TABLE 6

| No. | Aging condition | | | Oxide film thickness (nm) | Yellowness (b*) | Semi-quantitatively analyzed Zn (% by mass) | Comparison in IMC with Comparative Example |
|---|---|---|---|---|---|---|---|
| EXECUTED EXAMPLE 65 | Normal temperature | | 7 days | 2.5 | 2.97 | 0.661 | ○ |
| EXECUTED EXAMPLE 66 | 200° C. | | 5 min | 2.8 | 3.72 | 0.640 | ○ |
| EXECUTED EXAMPLE 67 | 200° C. | | 10 min | 3.3 | 3.78 | 0.794 | ○ |
| EXECUTED EXAMPLE 68 | 200° C. | | 60 min | 5.9 | 4.57 | 1.237 | ○ |
| COMPARATIVE EXAMPLE 6 | 0 | | | 0 | 0.7 | 2.56 | 0.467 | — |

In Comparative Example 6, solder balls of Sn-0.6% by mass Zn-0.5% by mass Cu, which were not subjected to any aging treatment, were used. In Comparative Example 6, when the solder ball having a yellowness of 2.56 was selected, the oxide film thickness thereof was 0.7 nm, and the concentration of Zn on the surface of the solder ball was 0.467% by mass. In Table 6, since the total thickness of the $Cu_3Sn$ layer and/or the Cu—Zn(—Sn) layer during joining in Comparative Example 6 was a reference for evaluation, it was indicated as "-", not "x".

In Executed Example 65, respective solder balls of Sn-0.6% by mass Zn-0.5% by mass Cu were subjected to aging treatment involving continuous exposure to the atmosphere at normal temperature of 20° C. to 30° C. for 7 days. According to Executed Example 65, when the solder ball having a yellowness of 2.97 was selected, the oxide film thickness thereof was 2.5 nm, and the concentration of Zn on the surface of the solder ball was 0.661% by mass. In addition, it was confirmed that the $Cu_3Sn$ layer and/or the Cu—Zn(—Sn) layer during joining were thinner than those of the solder ball of Comparative Example 6 which was not subjected to any aging treatment, and that the growth of the $Cu_3Sn$ layer and/or the Cu—Zn(—Sn) layer was suppressed.

In Executed Example 66, respective solder balls of Sn-0.6% by mass Zn-0.5% by mass Cu were subjected to aging treatment involving continuous exposure to the atmosphere at 200° C. for 5 minutes. According to Executed Example 66, when the solder ball having a yellowness of 3.72 was selected, the oxide film thickness thereof was 2.8 nm, and the concentration of Zn on the surface of the solder ball was 0.640% by mass. In addition, it was confirmed that the $Cu_3Sn$ layer and/or the Cu—Zn(—Sn) layer during joining were thinner than those of the solder ball of Comparative Example 6 which was not subjected to any aging treatment, and that the growth of the $Cu_3Sn$ layer and/or the Cu—Zn(—Sn) layer was suppressed.

In Executed Example 67, respective solder balls of Sn-0.6% by mass Zn-0.5% by mass Cu were subjected to aging treatment involving continuous exposure to the atmosphere at 200° C. for 10 minutes. According to Executed Example 67, when the solder ball having a yellowness of 3.78 was selected, the oxide film thickness thereof was 3.3 nm, and the concentration of Zn on the surface of the solder ball was 0.794% by mass. In addition, it was confirmed that the $Cu_3Sn$ layer and/or the Cu—Zn(—Sn) layer during joining were thinner than those of the solder ball of Comparative Example 6 which was not subjected to any aging treatment, and that the growth of the $Cu_3Sn$ layer and/or the Cu—Zn(—Sn) layer was suppressed.

In Executed Example 68, respective solder balls of Sn-0.6% by mass Zn-0.5% by mass Cu were subjected to aging treatment involving continuous exposure to the atmosphere at 200° C. for 60 minutes. According to Executed Example 68, when the solder ball having a yellowness of 4.57 was selected, the oxide film thickness thereof was 5.9 nm, and the concentration of Zn on the surface of the solder ball was 1.237% by mass. In addition, it was confirmed that the $Cu_3Sn$ layer and/or the Cu—Zn(—Sn) layer during joining were thinner than those of the solder ball of Comparative Example 6 which was not subjected to any aging treatment, and that the growth of the $Cu_3Sn$ layer and/or the Cu—Zn(—Sn) layer was suppressed.

Table 7 indicates the measurement results and evaluation results of the solder balls in each of which the alloy composition is Sn-0.6% by mass Zn-0.5% by mass Bi-0.5% by mass Sb-0.001% by mass Co.

TABLE 7

| No. | Aging condition | | Oxide film thickness (nm) | Yellowness (b*) | Semi-quantitatively analyzed Zn (% by mass) | Comparison in IMC with Comparative Example |
|---|---|---|---|---|---|---|
| EXECUTED EXAMPLE 69 | Normal temperature | 7 days | 2.3 | 2.91 | 0.675 | ○ |
| EXECUTED EXAMPLE 70 | 200° C. | 5 min | 2.8 | 3.82 | 0.636 | ○ |
| EXECUTED EXAMPLE 71 | 200° C. | 10 min | 3.0 | 3.90 | 0.791 | ○ |
| EXECUTED EXAMPLE 72 | 200° C. | 60 min | 5.2 | 4.59 | 1.257 | ○ |
| COMPARATIVE EXAMPLE 7 | 0 | 0 | 0.8 | 2.68 | 0.481 | — |

In Comparative Example 7, solder balls of Sn-0.6% by mass Zn-0.5% by mass Bi-0.5% by mass Sb-0.001% by mass Co, which were not subjected to any aging treatment, were used. In Comparative Example 7, when the solder ball having a yellowness of 2.68 was selected, the oxide film thickness thereof was 0.8 nm, and the concentration of Zn on the surface of the solder ball was 0.481% by mass. In Table 7, since the total thickness of the $Cu_3Sn$ layer and/or the Cu—Zn(—Sn) layer during joining in Comparative Example 7 was a reference for evaluation, it was indicated as "-", not "x".

In Executed Example 69, respective solder balls of Sn-0.6% by mass Zn-0.5% by mass Bi-0.5% by mass Sb-0.001% by mass Co were subjected to aging treatment involving continuous exposure to the atmosphere at normal temperature of 20° C. to 30° C. for 7 days. According to Executed Example 69, when the solder ball having a yellowness of 2.91 was selected, the oxide film thickness thereof was 2.3 nm, and the concentration of Zn on the surface of the solder ball was 0.675% by mass. In addition, it was confirmed that the $Cu_3Sn$ layer and/or the Cu—Zn(—Sn) layer during joining were thinner than those of the solder ball of Comparative Example 7 which was not subjected to any aging treatment, and that the growth of the $Cu_3Sn$ layer and/or the Cu—Zn(—Sn) layer was suppressed.

In Executed Example 70, respective solder balls of Sn-0.6% by mass Zn-0.5% by mass Bi-0.5% by mass Sb-0.001% by mass Co were subjected to aging treatment involving continuous exposure to the atmosphere at 200° C. for 5 minutes. According to Executed Example 70, when the solder ball having a yellowness of 3.82 was selected, the oxide film thickness thereof was 2.8 nm, and the concentration of Zn on the surface of the solder ball was 0.636% by mass. In addition, it was confirmed that the $Cu_3Sn$ layer and/or the Cu—Zn(—Sn) layer during joining were thinner than those of the solder ball of Comparative Example 7 which was not subjected to any aging treatment, and that the growth of the $Cu_3Sn$ layer and/or the Cu—Zn(—Sn) layer was suppressed.

In Executed Example 71, respective solder balls of Sn-0.6% by mass Zn-0.5% by mass Bi-0.5% by mass Sb-0.001% by mass Co were subjected to aging treatment involving continuous exposure to the atmosphere at 200° C. for 10 minutes. According to Executed Example 71, when the solder ball having a yellowness of 3.90 was selected, the oxide film thickness thereof was 3.0 nm, and the concentration of Zn on the surface of the solder ball was 0.791% by mass. In addition, it was confirmed that the $Cu_3Sn$ layer and/or the Cu—Zn(—Sn) layer during joining were thinner than those of the solder ball of Comparative Example 7 which was not subjected to any aging treatment, and that the growth of the $Cu_3Sn$ layer and/or the Cu—Zn(—Sn) layer was suppressed.

In Executed Example 72, respective solder balls of Sn-0.6% by mass Zn-0.5% by mass Bi-0.5% by mass Sb-0.001% by mass Co were subjected to aging treatment involving continuous exposure to the atmosphere at 200° C. for 60 minutes. According to Executed Example 72, when the solder ball having a yellowness of 4.59 was selected, the oxide film thickness thereof was 5.2 nm, and the concentration of Zn on the surface of the solder ball was 1.257% by mass. In addition, it was confirmed that the $Cu_3Sn$ layer and/or the Cu—Zn(—Sn) layer during joining were thinner than those of the solder ball of Comparative Example 7 which was not subjected to any aging treatment, and that the growth of the $Cu_3Sn$ layer and/or the Cu—Zn(—Sn) layer was suppressed.

Table 8 indicates the measurement results and evaluation results of the solder balls in each of which the alloy composition is Sn-0.6% by mass Zn-0.5% by mass In-0.01% by mass Ni-0.01% by mass Fe.

surface of the solder ball was 0.682% by mass. In addition, it was confirmed that the $Cu_3Sn$ layer and/or the Cu—Zn(—Sn) layer during joining were thinner than those of the solder ball of Comparative Example 8 which was not subjected to any aging treatment, and that the growth of the $Cu_3Sn$ layer and/or the Cu—Zn(—Sn) layer was suppressed.

In Executed Example 74, respective solder balls of Sn-0.6% by mass Zn-0.5% by mass In-0.01% by mass Ni-0.01% by mass Fe were subjected to aging treatment involving continuous exposure to the atmosphere at 200° C. for 5 minutes. According to Executed Example 74, when the solder ball having a yellowness of 3.71 was selected, the oxide film thickness thereof was 3.3 nm, and the concentration of Zn on the surface of the solder ball was 0.633% by mass. In addition, it was confirmed that the $Cu_3Sn$ layer and/or the Cu—Zn(—Sn) layer during joining were thinner than those of the solder ball of Comparative Example 8 which was not subjected to any aging treatment, and that the growth of the $Cu_3Sn$ layer and/or the Cu—Zn(—Sn) layer was suppressed.

In Executed Example 75, respective solder balls of Sn-0.6% by mass Zn-0.5% by mass In-0.01% by mass Ni-0.01% by mass Fe were subjected to aging treatment involving continuous exposure to the atmosphere at 200° C. for 10 minutes. According to Executed Example 75, when the solder ball having a yellowness of 3.82 was selected, the oxide film thickness thereof was 3.9 nm, and the concentration of Zn on the surface of the solder ball was 0.804% by mass. In addition, it was confirmed that the $Cu_3Sn$ layer and/or the Cu—Zn(—Sn) layer during joining were thinner than those of the solder ball of Comparative Example 8

TABLE 8

| No. | Aging condition | | Oxide film thickness (nm) | Yellowness (b*) | Semi-quantitatively analyzed Zn (% by mass) | Comparison in IMC with Comparative Example |
|---|---|---|---|---|---|---|
| EXECUTED EXAMPLE 73 | Normal temperature | 7 days | 2.5 | 2.75 | 0.682 | ○ |
| EXECUTED EXAMPLE 74 | 200° C. | 5 min | 3.3 | 3.71 | 0.633 | ○ |
| EXECUTED EXAMPLE 75 | 200° C. | 10 min | 3.9 | 3.82 | 0.804 | ○ |
| EXECUTED EXAMPLE 76 | 200° C. | 60 min | 6.1 | 4.78 | 1.349 | ○ |
| COMPARATIVE EXAMPLE 8 | 0 | 0 | 1.0 | 2.48 | 0.508 | — |

In Comparative Example 8, solder balls of Sn-0.6% by mass Zn-0.5% by mass In-0.01% by mass Ni-0.01% by mass Fe, which were not subjected to any aging treatment, were used. In Comparative Example 8, when the solder ball having a yellowness of 2.48 was selected, the oxide film thickness thereof was 1.0 nm, and the concentration of Zn on the surface of the solder ball was 0.508% by mass. In Table 8, since the total thickness of the $Cu_3Sn$ layer and/or the Cu—Zn(—Sn) layer during joining in Comparative Example 8 was a reference for evaluation, it was indicated as "-", not "x".

In Executed Example 73, respective solder balls of Sn-0.6% by mass Zn-0.5% by mass In-0.01% by mass Ni-0.01% by mass Fe were subjected to aging treatment involving continuous exposure to the atmosphere at normal temperature of 20° C. to 30° C. for 7 days. According to Executed Example 73, when the solder ball having a yellowness of 2.75 was selected, the oxide film thickness thereof was 2.5 nm, and the concentration of Zn on the which was not subjected to any aging treatment, and that the growth of the $Cu_3Sn$ layer and/or the Cu—Zn(—Sn) layer was suppressed.

In Executed Example 76, respective solder balls of Sn-0.6% by mass Zn-0.5% by mass In-0.01% by mass Ni-0.01% by mass Fe were subjected to aging treatment involving continuous exposure to the atmosphere at 200° C. for 60 minutes. According to Executed Example 76, when the solder ball having a yellowness of 4.78 was selected, the oxide film thickness was 6.1 nm, and the concentration of Zn on the surface of the solder ball was 1.349% by mass. In addition, it was confirmed that the $Cu_3Sn$ layer and/or the Cu—Zn(—Sn) layer during joining were thinner than those of the solder ball of Comparative Example 8 which was not subjected to any aging treatment, and that the growth of the $Cu_3Sn$ layer and/or the Cu—Zn(—Sn) layer was suppressed.

Table 9 indicates the measurement results and evaluation results of the solder balls each of which the alloy composition is Sn-0.0001% by mass Zn.

| No. | Aging condition Temperature/time | Alloy composition | Oxide film thickness (nm) | Yellowness (b*) | Semi-quantitatively analyzed Zn (% by mass) | Whether IMC layers became thinner than those of Comparative Example |
|---|---|---|---|---|---|---|
| COMPARATIVE EXAMPLE 9 | Normal temperature/3 days | Sn—0.0001Zn | 1.0 | 3.36 | 0.000 | X |
| COMPARATIVE EXAMPLE 10 | Normal temperature/7 days | Sn—0.0001Zn | 1.2 | 3.36 | 0.000 | X |
| COMPARATIVE EXAMPLE 11 | 200° C./0.5 min | Sn—0.0001Zn | 1.2 | 3.37 | 0.000 | X |
| COMPARATIVE EXAMPLE 12 | 200° C./1 min | Sn—0.0001Zn | 1.4 | 3.37 | 0.000 | X |
| COMPARATIVE EXAMPLE 13 | 200° C./1.5 min | Sn—0.0001Zn | 1.6 | 3.41 | 0.000 | X |
| COMPARATIVE EXAMPLE 14 | 200° C./2 min | Sn—0.0001Zn | 1.8 | 3.43 | 0.000 | X |
| COMPARATIVE EXAMPLE 15 | 200° C./5 min | Sn—0.0001Zn | 2.2 | 3.44 | 0.000 | X |
| COMPARATIVE EXAMPLE 16 | 200° C./10 min | Sn—0.0001Zn | 2.3 | 3.92 | 0.000 | X |
| COMPARATIVE EXAMPLE 17 | 200° C./30 min | Sn—0.0001Zn | 3.5 | 5.34 | 0.000 | X |
| COMPARATIVE EXAMPLE 18 | 200° C./60 min | Sn—0.0001Zn | 12.5 | 15.23 | 0.000 | X |
| COMPARATIVE EXAMPLE 19 | 200° C./90 min | Sn—0.0001Zn | 14.0 | 19.04 | 0.000 | X |
| COMPARATIVE EXAMPLE 20 | 200° C./120 min | Sn—0.0001Zn | 17.3 | 22.07 | 0.000 | X |
| COMPARATIVE EXAMPLE 21 | 0 | Sn—0.0001Zn | 0.7 | 3.34 | 0.000 | — |

In Comparative Example 21, solder balls of Sn-0.0001% by mass Zn, which were not subjected to any aging treatment, were used. In Comparative Example 21, when the solder ball having a yellowness of 3.34 was selected, the oxide film thickness thereof was 0.7 nm. On the other hand, it was confirmed that, since only a very small amount of Zn was added to the solder ball, the concentration of Zn on the surface of the solder ball was 0.000% by mass, and that the growth of the $Cu_3Sn$ layer during joining was not suppressed. No Cu—Zn(—Sn) layer was seen probably because the content of Zn was very small. In Table 9, since the total thickness of the $Cu_3Sn$ layer and/or the Cu—Zn(—Sn) layer during joining in Comparative Example 21 was a reference for evaluation, it was indicated as "-", not "x".

In Comparative Examples 9 to 20, an oxide film having a predetermined thickness was formed on the surface of each of the respective solder balls according to the conditions for the aging treatments, and the yellowness according to the oxide film thickness was measured. When the aging treatment time was 60 minutes or more as in Comparative Examples 18 to 20, the oxide films were significantly thickened, and it was confirmed that the yellowness increased as the oxide film thickness increased. On the other hand, since only a very small amount of Zn was added to the solder ball, the concentration of Zn on the surface of the solder ball was 0.000% by mass in all of Comparative Examples 9 to 20, and it was confirmed that the growth of the $Cu_3Sn$ layer during joining was not suppressed as in Comparative Example 21.

Table 10 indicates the measurement results and evaluation results of the solder balls each of which the alloy composition is Sn-0.7% by mass Cu.

| No. | Aging condition Temperature/time | Alloy composition | Oxide film thickness (nm) | Yellowness (b*) | Semi-quantitatively analyzed Zn (% by mass) | Whether IMC layers became thinner than those of Comparative Example |
|---|---|---|---|---|---|---|
| COMPARATIVE EXAMPLE 22 | Normal temperature/3 days | Sn—0.7Cu | 0.9 | 3.71 | 0.000 | X |
| COMPARATIVE EXAMPLE 23 | Normal temperature/7 days | Sn—0.7Cu | 1.2 | 3.71 | 0.000 | X |
| COMPARATIVE EXAMPLE 24 | 200° C./0.5 min | Sn—0.7Cu | 1.2 | 3.70 | 0.000 | X |
| COMPARATIVE EXAMPLE 25 | 200° C./1 min | Sn—0.7Cu | 1.4 | 3.71 | 0.000 | X |
| COMPARATIVE EXAMPLE 26 | 200° C./1.5 min | Sn—0.7Cu | 1.5 | 3.76 | 0.000 | X |
| COMPARATIVE EXAMPLE 27 | 200° C./2 min | Sn—0.7Cu | 1.8 | 3.69 | 0.000 | X |
| COMPARATIVE EXAMPLE 28 | 200° C./5 min | Sn—0.7Cu | 2.0 | 3.70 | 0.000 | X |
| COMPARATIVE EXAMPLE 29 | 200° C./10 min | Sn—0.7Cu | 2.1 | 3.83 | 0.000 | X |
| COMPARATIVE EXAMPLE 30 | 200° C./30 min | Sn—0.7Cu | 3.3 | 5.27 | 0.000 | X |
| COMPARATIVE EXAMPLE 31 | 200° C./60 min | Sn—0.7Cu | 12.3 | 15.00 | 0.000 | X |
| COMPARATIVE EXAMPLE 32 | 200° C./90 min | Sn—0.7Cu | 13.8 | 18.88 | 0.000 | X |

| No. | Aging condition Temperature/time | Alloy composition | Oxide film thickness (nm) | Yellowness (b*) | Semi-quantitatively analyzed Zn (% by mass) | Whether IMC layers became thinner than those of Comparative Example |
|---|---|---|---|---|---|---|
| COMPARATIVE EXAMPLE 33 | 200° C./120 min | Sn—0.7Cu | 17.1 | 21.54 | 0.000 | X |
| COMPARATIVE EXAMPLE 34 | 0 | Sn—0.7Cu | 0.7 | 3.72 | 0.000 | — |

In Comparative Example 34, solder balls of Sn-0.7% by mass Cu, which were not subjected to any aging treatment, were used. In Comparative Example 34, when the solder ball having a yellowness of 3.72 was selected, the oxide film thickness thereof was 0.7 nm. On the other hand, since no Zn was added to the solder ball, the concentration of Zn on the surface of the solder ball was 0.000% by mass, and it was confirmed that the growth of the $Cu_3Sn$ layer during joining was not suppressed. The Cu—Zn(—Sn) layer was not seen because Zn was not contained. In Table 10, since the total thickness of the $Cu_3Sn$ layer and/or the Cu—Zn(—Sn) layer during joining in Comparative Example 34 was a reference for evaluation, it was indicated as "-", not "x".

In Comparative Examples 22 to 33, an oxide film having a predetermined thickness was formed on the surface of each of the respective solder balls according to the conditions for the aging treatment, and the yellowness according to the oxide film thickness was measured. When the aging treatment time was 60 minutes or more as in Comparative Examples 31 to 33, the oxide films were significantly thickened, and it was confirmed that the yellowness increased as the oxide film thickness increased. On the other hand, since no Zn was added to the solder ball, the concentration of Zn on the surface of the solder ball was 0.000% by mass in all of Comparative Examples 22 to 33, and it was confirmed that the growth of the $Cu_3Sn$ layer during joining was not suppressed as in Comparative Example 34.

From the above results, it was confirmed that, in the case of solder balls having a Zn content of 0.2 to 2.2% by mass and a spherical diameter of 120 μm or less, aging treatment was performed to produce solder balls having a yellowness of 2.70 or more and 9.52 or less or an oxide film thickness of 1.5 nm or more and 10.7 nm or less, whereby Zn was enriched on the surface of each of the solder balls. It was also confirmed that, as a result, the oxide film containing zinc oxide (ZnO), which was formed on the surface of each of the solder balls, functioned as a protective film, whereby the growth of new $Cu_3Sn$ layer and/or Cu—Zn(—Sn) layer on the oxide film containing zinc oxide (ZnO) could be suppressed as compared with general solder ball not subjected to any aging treatment.

Figure 1A:
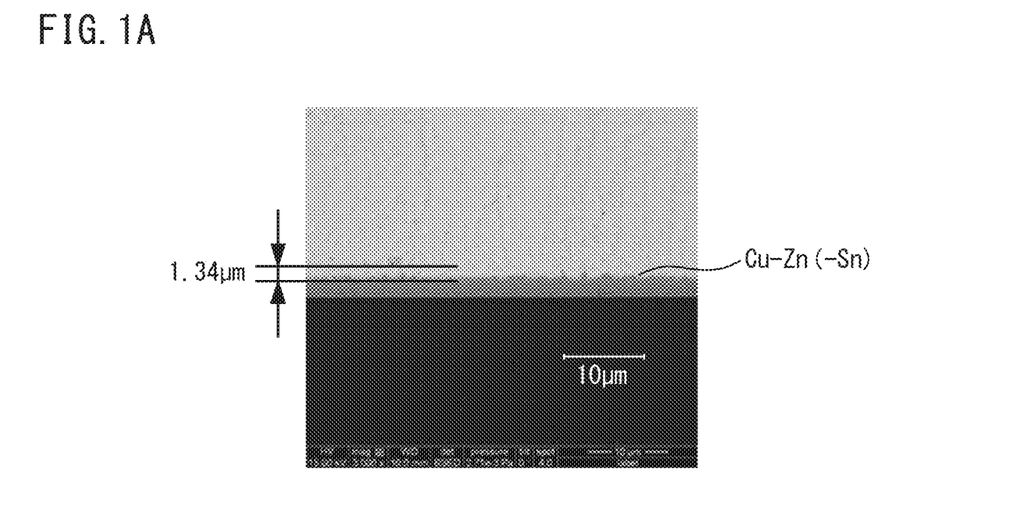
FIG. 1A is an SEM image showing a joined interface between a solder ball and an electrode when soldering is performed using a solder ball of Sn-2.0% by mass Zn subjected to aging treatment.
Figure 1B:
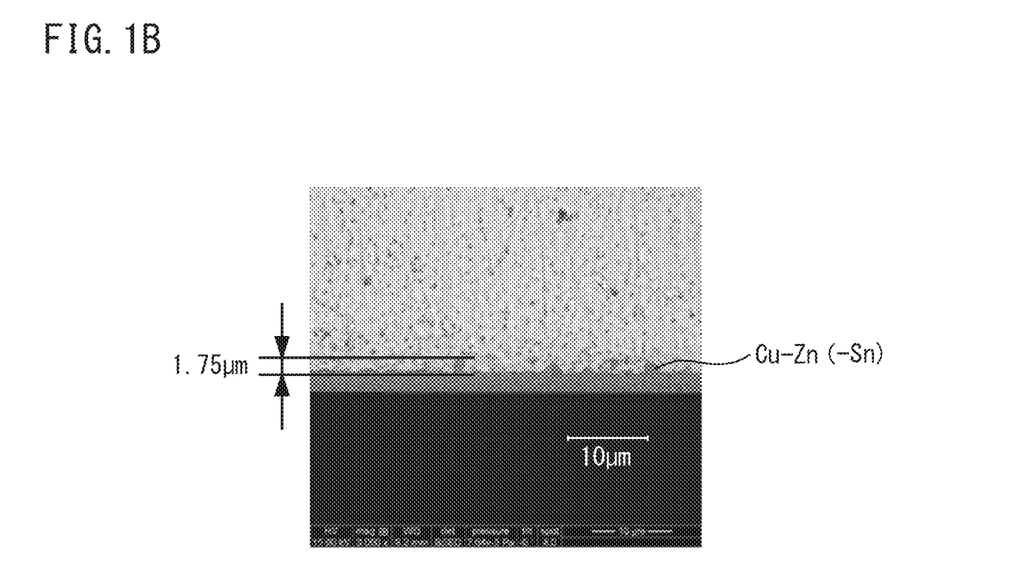
FIG. 1B is an SEM image showing a joined interface between a solder ball and an electrode when soldering is performed using a solder ball of Sn-2.0% by mass Zn not subjected to aging treatment.

The following will describe the joining interface between the solder ball and the electrode when soldering was performed using the solder ball of Sn-2.0% by mass Zn subjected to aging treatment in Executed Example 31 and the solder ball of Sn-2.0% by mass Zn not subjected to any aging treatment in Comparative Example 3 with reference to SEM images.

FIG. 1A shows an SEM image of Executed Example 31, and FIG. 1B shows an SEM image of Comparative Example 3.

In comparison in terms of the growth of the $Cu_3Sn$ layer and/or the Cu—Zn(—Sn) layer at the joining interface between the solder ball and the electrode, because of a high Zn content of 2.0% by mass in Executed Example 31 and Comparative Example 3, the Cu—Zn(—Sn) layer was formed in both cases. The thickness of the Cu—Zn(—Sn) layer was 1.34 μm in Executed Example 31 shown in FIG. 1A, and was 1.75 μm in Comparative Example 3 shown in FIG. 1B. Thus, it was confirmed that the growth of the Cu—Zn(—Sn) layer could be suppressed more when the solder ball of Executed Example 31, which was subjected to aging treatment, was used.

From the above, it was found that, in the case of solder ball having an oxide film thickness within the range of 1.5 nm or more and 10.7 nm or less, a yellowness of 2.70 or more and 9.52 or less and a spherical diameter of 0.1 to 120 μm, even when the solder ball had a composition containing 0.2 to 2.2% by mass of Zn, the enrichment of Zn on the surface thereof made it possible to more effectively suppress the growth of the $Cu_3Sn$ layer and/or the Cu—Zn(—Sn) layer during joining. Although only the comparative photographs of the solder balls each having a composition of Sn-2.0% by mass Zn are shown in FIG. 1A and FIG. 1B, as for the growth behavior of the $Cu_3Sn$ layer and/or the Cu—Zn(—Sn) layer with and without the aging treatment, the same tendency as the composition of Sn-2.0% by mass Zn is also confirmed in the compositions of other Executed Examples 1 to 30 and 32 to 60 indicated in Tables 1 through 4.

Next, the α doses when solder balls of Sn-0.2% by mass Zn, Sn-0.6% by mass Zn, Sn-2.0% by mass Zn and Sn-2.2% by mass Zn, which had been subjected to aging treatment, having different purities of Zn were respectively measured.

Measurement of α Dose

The α dose of each of the solder balls was measured using an α-ray measuring device of a gas flow proportional counter. Each measurement sample was a sample obtained by spreading solder balls on a bottom of a flat shallow container of 300 mm×300 mm until the bottom could not be seen. The measurement sample was placed in the α-ray measuring device and allowed to stand for 24 hours under PR-10 gas flow, and then the α dose was measured. In addition, the PR-10 gas (argon 90%-methane 10%) used for the measurement was a PR-10 gas after the lapse of 3 weeks or more from filling in a gas cylinder. The reason for using the cylinder after the lapse of 3 weeks or more was that the measurement was made in accordance with the JEDEC (Joint Electron Device Engineering Council) STANDARD-Alpha Radiation Measurement in Electronic Materials JESD221, as defined by the JEDEC, so as to prevent the generation of α rays by radon in the atmosphere entering the gas cylinder.

Table 11 indicates the relationship among the purity of Sn, the purity of Zn and the α dose in the solder balls. In Table 11, for the purities of Sn and Zn, "3N" indicate 99.9% by mass and "5N" indicate 99.999% by mass.

TABLE 11

| No. | Composition | Sn purity | Zn purity | α dose, cph/cm2 |
|---|---|---|---|---|
| EXECUTED EXAMPLE 77 | Sn—0.2Zn | 5N | 5N | <0.0010 |
| EXECUTED EXAMPLE 78 | Sn—0.6Zn | 5N | 5N | <0.0010 |
| EXECUTED EXAMPLE 79 | Sn—2.0Zn | 5N | 5N | <0.0010 |
| EXECUTED EXAMPLE 80 | Sn—2.2Zn | 5N | 5N | <0.0010 |
| COMPARATIVE EXAMPLE 35 | Sn—0.2Zn | 5N | 3N | >1 |
| COMPARATIVE EXAMPLE 36 | Sn—0.6Zn | 5N | 3N | >1 |
| COMPARATIVE EXAMPLE 37 | Sn—2.0Zn | 5N | 3N | >1 |
| COMPARATIVE EXAMPLE 38 | Sn—2.2Zn | 5N | 3N | >1 |

When the purity of Sn was 5N and the purity of Zn was 5N, as indicated in Executed Examples 77 to 80 in Table 11, the α dose of each Executed Example was 0.0010 cph/cm$^2$ or less, which was below the required 0.0200 cph/cm$^2$. On the other hand, when the purity of Sn was 5N and the purity of Zn was 3N, as indicated in Comparative Examples 35 to 38, the α dose of each Comparative Example exceeded 1, which could not satisfy the required condition of 0.0200 cph/cm$^2$. Thus, it was confirmed that the condition for α dose could be satisfied by selecting solder balls wherein the purity of Sn was 5N and the purity of Zn was 5N. Even when producing solder balls having added thereto Ag, Cu, Bi, In, Sb, Ni, Co, Fe, Ge, and/or P other than Sn and Zn, the α dose of each of the solder balls would be 0.0200 cph/cm$^2$ or less if the respective elements used have high purity and provide an α dose of 0.0200 cph/cm$^2$ or less.

The technical scope of the present invention is not limited to the above-described embodiment, and includes various modifications added to the above-described embodiments without departing from the scope of the present invention.

The terms and expressions which have been employed in the foregoing description are used therein as terms of description and not of limitation, and these are no intention, in the use of such terms and expressions, of excluding equivalent of the features shown and described or portions thereof, it being recognized that the scope of the invention is defined and limited only by the claims.

It should be understood by those skilled in the art that various modifications, combinations, sub-combinations and alterations may occur depending on design requirements and other factors insofar as they are within the scope of the appended claims or the equivalents thereof.

What is claimed is:

1. A solder ball comprising:
0.2 to 2.2% by mass of Zn; and
a balance of Sn,
wherein the solder ball has a spherical diameter of 0.1 to 120 μm, and
wherein the solder ball has a yellowness (b*) in an L*a*b* color system of 2.70 or more and 9.52 or less and/or a thickness of an oxide film on a surface of the solder ball is 1.5 nm or more and 10.7 nm or less.

2. The solder ball according to claim 1, further comprising at least one element selected from a group consisting of Ag, Cu, Bi, In, Ni, Sb, Co, Fe, Ge, and P,
wherein content of Ag is 0 to 4% by mass; content of Cu is 0 to 1.0% by mass; content of Bi, In or Sb is 0 to 3% by mass in total; and content of Ni, Co, Fe, Ge or P is 0 to 0.1% by mass in total.

3. The solder ball according to claim 1, having an α dose of 0.0200 cph/cm$^2$ or less.

4. The solder ball according to claim 2, having an α dose of 0.0200 cph/cm$^2$ or less.

5. A joining method comprising the steps of:
arranging a plurality of the solder balls on electrodes, each solder ball containing 0.2 to 2.2% by mass of Zn; and a balance of Sn,
wherein the solder ball has a spherical diameter of 0.1 to 120 μm, and
wherein the solder ball has a yellowness (b*) in an L*a*b* color system of 2.70 or more and 9.52 or less and/or a thickness of an oxide film on a surface of the solder ball is 1.5 nm or more and 10.7 nm or less; and
melting the plurality of solder balls arranged on the electrodes using an organic acid gas.

6. The joining method according to claim 5 comprising the steps of:
arranging a plurality of the solder balls on electrodes, each solder ball further containing at least one element selected from a group consisting of Ag, Cu, Bi, In, Ni, Sb, Co, Fe, Ge, and P, wherein content of Ag is 0 to 4% by mass; content of Cu is 0 to 1.0% by mass; content of Bi, In or Sb is 0 to 3% by mass in total; and content of Ni, Co, Fe, Ge or P is 0 to 0.1% by mass in total; and
melting the plurality of solder balls arranged on the electrodes using an organic acid gas.

7. The joining method according to claim 5 comprising the steps of:
arranging a plurality of the solder balls on electrodes, each solder ball having an α dose of 0.0200 cph/cm$^2$ or less; and
melting the plurality of solder balls arranged on the electrodes using an organic acid gas.

8. The joining method according to claim 6 comprising the steps of:
arranging a plurality of the solder balls on electrodes, each solder ball having an α dose of 0.0200 cph/cm$^2$ or less; and
melting the plurality of solder balls arranged on the electrodes using an organic acid gas.

* * * * *